United States Patent
Feng et al.

(10) Patent No.: US 11,145,752 B2
(45) Date of Patent: Oct. 12, 2021

(54) RESIDUE REMOVAL IN METAL GATE CUTTING PROCESS

(71) Applicant: Taiwan Semiconductor Manufacturing Company, Ltd., Hsinchu (TW)

(72) Inventors: Chieh-Ning Feng, Taichung (TW); Chih-Chang Hung, Hsinchu (TW); Bing-Hung Chen, San-Xia Town (TW); Yih-Ann Lin, Jhudong Township (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/572,831

(22) Filed: Sep. 17, 2019

(65) Prior Publication Data

US 2021/0083072 A1    Mar. 18, 2021

(51) Int. Cl.
*H01L 29/66* (2006.01)
*H01L 21/3213* (2006.01)

(52) U.S. Cl.
CPC .... *H01L 29/6681* (2013.01); *H01L 21/32139* (2013.01)

(58) Field of Classification Search
None
See application file for complete search history.

(56) References Cited

U.S. PATENT DOCUMENTS

| | | | |
|---|---|---|---|
| 10,811,320 B2 | 10/2020 | Huang et al. | |
| 2008/0093690 A1 | 4/2008 | Reichenbach et al. | |
| 2015/0348850 A1 | 12/2015 | Lee et al. | |
| 2016/0380077 A1 | 12/2016 | Lu et al. | |
| 2018/0204933 A1 | 7/2018 | Zhang | |
| 2018/0315857 A1* | 11/2018 | Li | H01L 29/7854 |
| 2019/0006486 A1 | 1/2019 | Ching et al. | |
| 2019/0035786 A1 | 1/2019 | Huang et al. | |
| 2019/0067120 A1 | 2/2019 | Ching et al. | |
| 2019/0067446 A1 | 2/2019 | Ching et al. | |
| 2019/0139969 A1* | 5/2019 | Yin | H01L 29/66545 |
| 2019/0333769 A1* | 10/2019 | Chen | H01L 29/4966 |
| 2020/0105613 A1 | 4/2020 | Hung et al. | |
| 2020/0312849 A1* | 10/2020 | Cheng | H01L 29/41791 |
| 2020/0357896 A1* | 11/2020 | Cheng | H01L 21/823437 |

FOREIGN PATENT DOCUMENTS

| | | |
|---|---|---|
| DE | 102019101555 A1 | 4/2020 |
| JP | 2008100347 A | 5/2008 |
| KR | 940016729 A | 7/1994 |
| KR | 20190038393 A | 4/2019 |

* cited by examiner

*Primary Examiner* — Zandra V Smith
*Assistant Examiner* — Lawrence C Tynes, Jr.
(74) *Attorney, Agent, or Firm* — Slater Matsil, LLP

(57) ABSTRACT

A method includes forming a gate dielectric layer, forming a metal gate strip over a bottom portion of the gate dielectric layer, and performing a first etching process on the metal gate strip to remove a portion of the metal gate strip. The first etching process is performed anisotropically. After the first etching process, a second etching process is performed on the metal gate strip to remove a residue portion of the metal gate strip. The second etching process includes an isotropic etching process. A dielectric material is filled into a recess left by the etched portion and the etched residue portion of the metal gate strip.

19 Claims, 37 Drawing Sheets

RESIDUE REMOVAL IN METAL GATE CUTTING PROCESS

BACKGROUND

Metal-Oxide-Semiconductor (MOS) devices are basic building elements in integrated circuits. An existing MOS device typically has a gate electrode having polysilicon doped with p-type or n-type impurities, using doping operations such as ion implantation or thermal diffusion. The work function of the gate electrode was adjusted to the band-edge of the silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also referred to as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes, so that the metallic gates used in NMOS devices and PMOS devices may also have band-edge work functions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
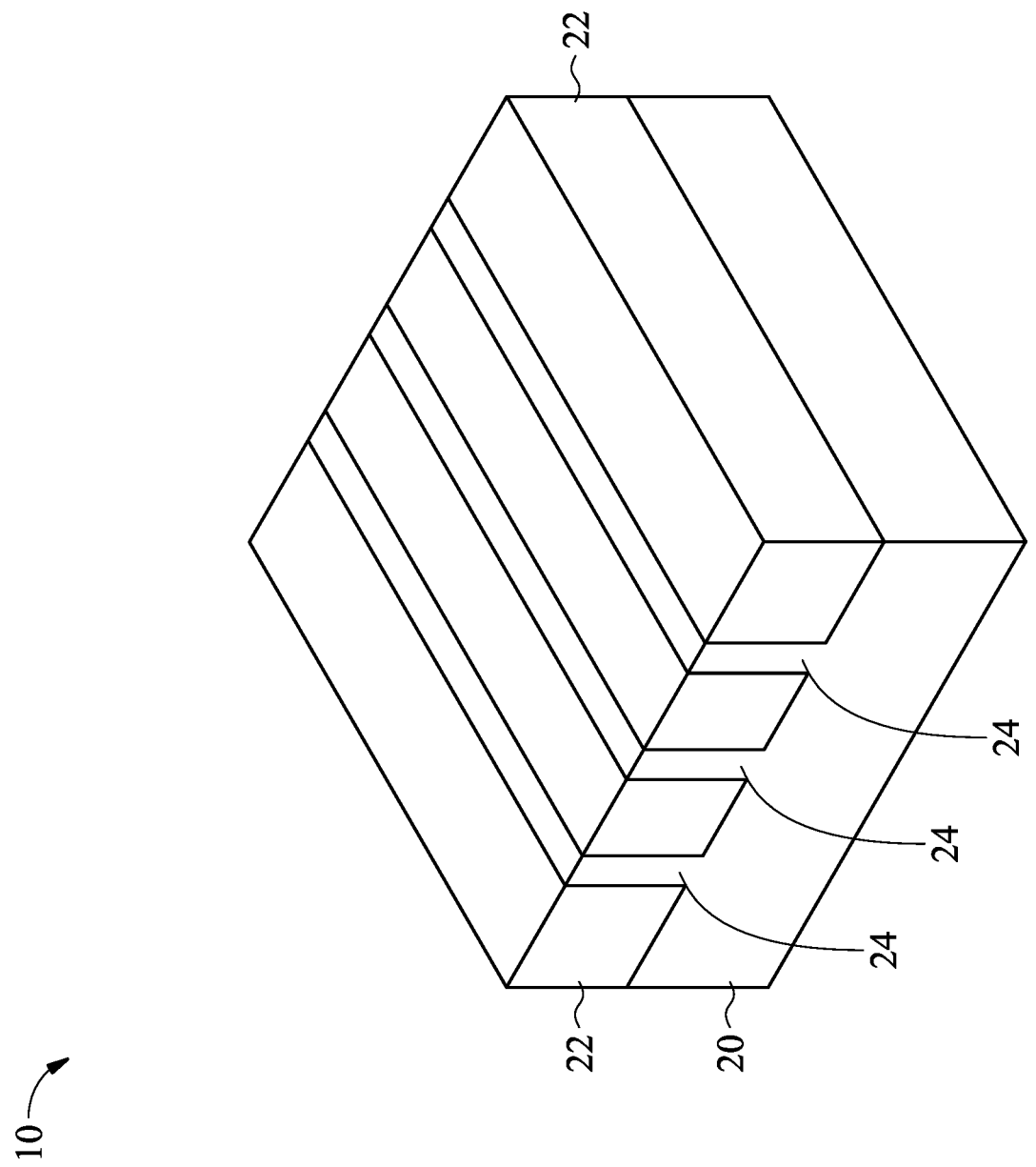
FIGS. 1-4, 5A, 5B, 6-9, 10A, 10B, 11A, 11B, 11C, 12A, 12B, 12C, 13A, 13B, 13C, 14A, 14B, 14C, 14D, 15A, 15B, 16A, 16B, 16C, 17A, 17B, 17C, 18A, and 18B illustrate the perspective views, cross-sectional views, and plane views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors formed using cut-metal-gate processes and the methods of forming the same are provided in accordance with some embodiments. The intermediate stages of forming the transistors are illustrated in accordance with some embodiments. Some variations of some embodiments are discussed. Throughout the various views and illustrative embodiments, like reference numbers are used to designate like elements. In some illustrated embodiments, the formation of Fin Field-Effect Transistors (FinFETs) is used as an example to explain the concept of the present disclosure. Other types of transistors such as planar transistors, Gate-All-Around (GAA) transistors, or the like may also adopt the embodiments of the present disclosure. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

Figure 21:
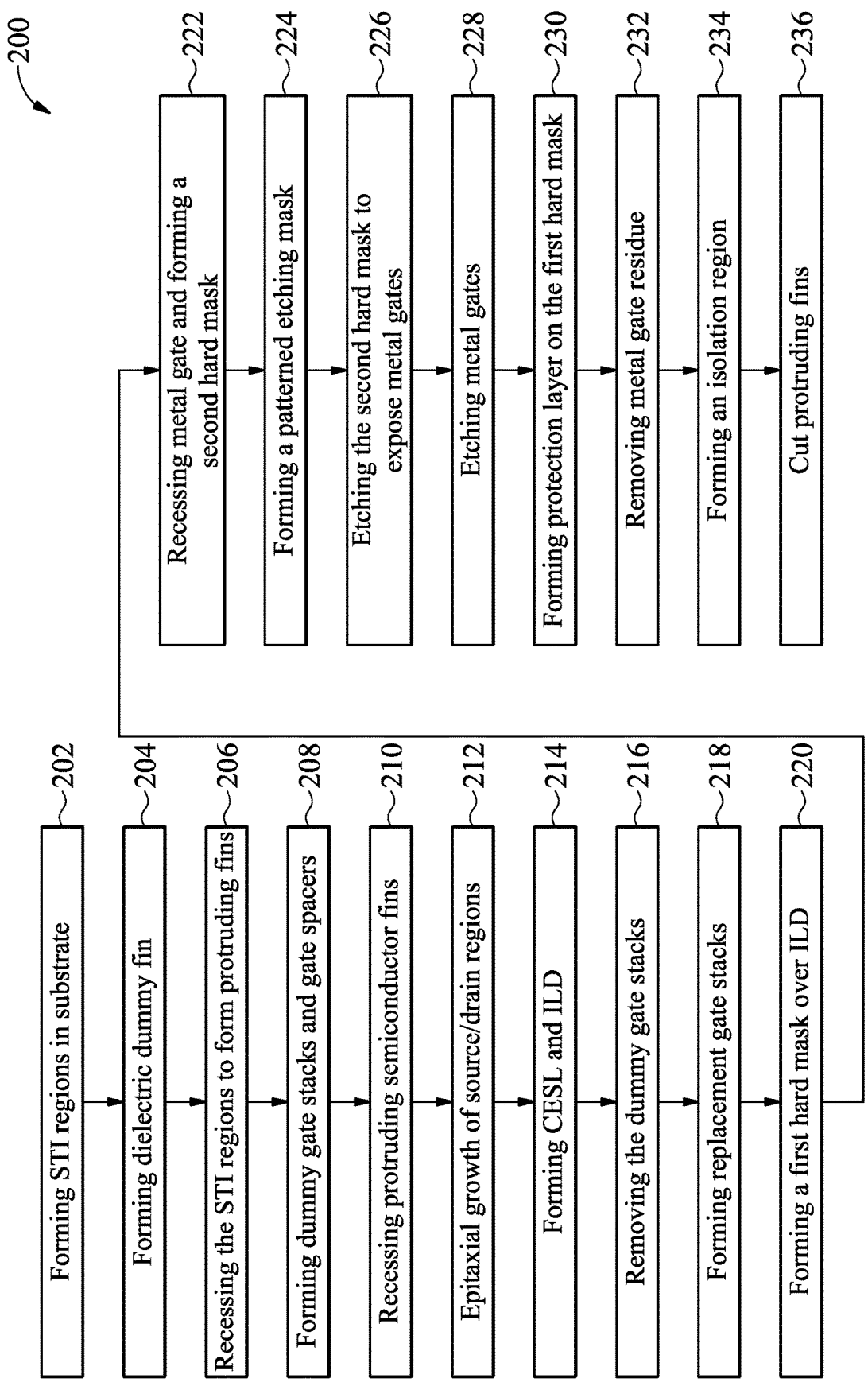
FIG. 21 illustrates a process flow for forming FinFETs in accordance with some embodiments.

FIGS. 1-4, 5A, 5B, 6-9, 10A, 10B, 11A, 11B, 11C, 12A, 12B, 12C, 13A, 13B, 13C, 14A, 14B, 14C, 14D, 15A, 15B, 16A, 16B, 16C, 17A, 17B, 17C, 18A, and 18B illustrate the cross-sectional views and perspective views of intermediate stages in the formation of FinFETs in accordance with some embodiments of the present disclosure. The processes shown in these Figures are also reflected schematically in the process flow 200 as shown in FIG. 21.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The respective process is illustrated as process 202 in the process flow 200 as shown in FIG. 21. The portions of substrate 20 between neighboring STI regions 22 are referred to as semiconductor strips 24. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy process to regrow another semiconductor material in the recesses. Accordingly, semiconductor strips 24 are formed of a semiconductor material different from that of substrate 20. In accordance with some embodiments, semiconductor strips 24 are formed of Si, SiP, SiC, SiPC, SiGe, SiGeB, Ge, or a III-V compound semiconductor such as InP, GaAs, AlAs, InAs, InAlAs, InGaAs, or the like.

STI regions 22 may include a liner oxide (not shown), which may be a thermal oxide formed through the thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), Chemical Vapor Deposition (CVD), or the like. STI regions 22 may also include a dielectric material over the liner oxide, wherein the dielectric material may be formed using Flowable Chemical Vapor Deposition (FCVD), spin-on, or the like.

Figure 2:
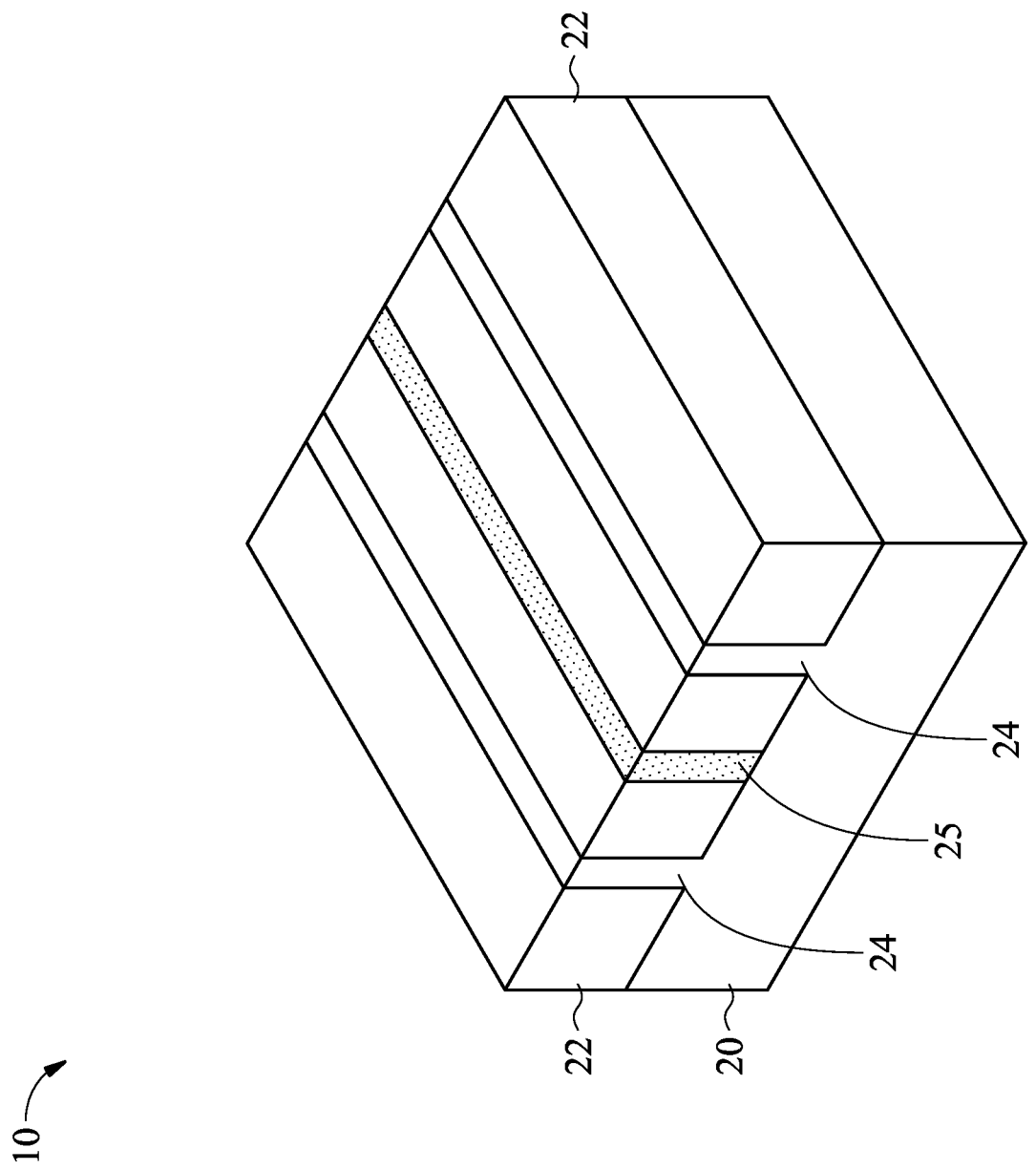

FIG. 2 illustrates the formation of dielectric dummy strip 25, which may be formed by etching one of the semiconductor strips 24 to form a recess, and then filling the recessing with a dielectric material. The respective process is illustrated as process 204 in the process flow 200 as shown in FIG. 21. The dielectric material may include or be a high-k dielectric material such as silicon nitride. Also, the material of dielectric dummy strip 25 is selected so that it has a high etching selectivity with relative to the materials of metal gates (such as tungsten and titanium nitride) and the materials of STI regions 22 (such as silicon oxide). The bottom surface of dielectric dummy strip 25 may be higher than, level with, or lower than, the bottom surfaces of STI regions 22.

Figure 3:
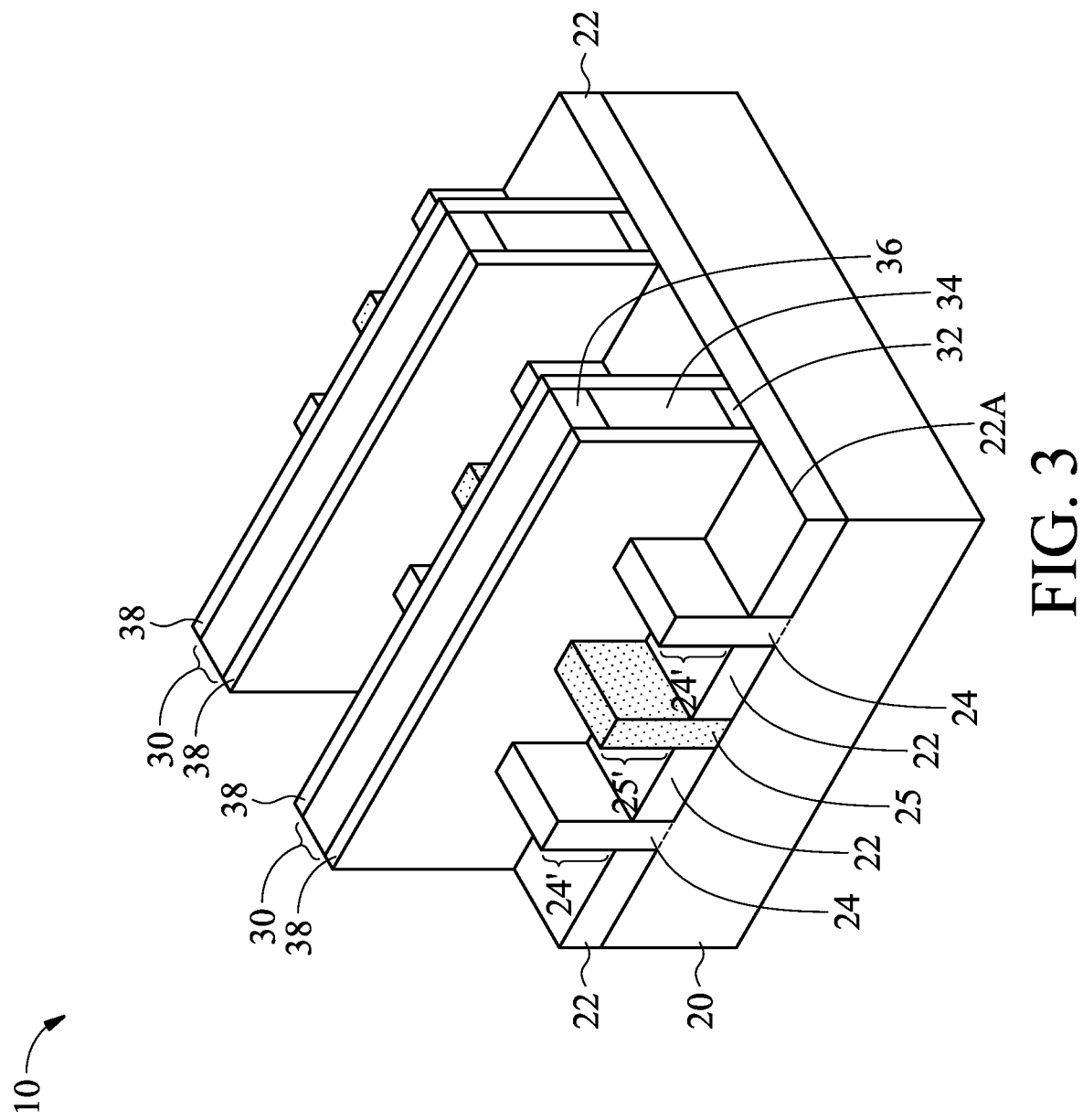

Referring to FIG. 3, STI regions 22 are recessed. The top portions of semiconductor strips 24 and dielectric dummy strip 25 protrude higher than the top surfaces 22A of the remaining portions of STI regions 22 to form protruding fins 24' and 25', respectively. The respective process is illustrated as process 206 in the process flow 200 as shown in FIG. 21. The etching may be performed using a dry etching process, wherein $HF_3$ and $NH_3$ are used as the etching gases. In accordance with alternative embodiments of the present disclosure, the recessing of STI regions 22 is performed using a wet etch process. The etching chemical may include HF solution, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Further referring to FIG. 3, dummy gate stacks 30 are formed on the top surfaces and the sidewalls of (protruding) fins 24' and 25'. The respective process is illustrated as process 208 in the process flow 200 as shown in FIG. 21. Dummy gate stacks 30 may include dummy gate dielectrics 32 and dummy gate electrodes 34 over dummy gate dielectrics 32. Dummy gate electrodes 34 may be formed, for example, using polysilicon, and other materials may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, or multi-layers thereof. Dummy gate stacks 30 may cross over a single one or a plurality of protruding fins 24' and 25' and/or STI regions 22. Dummy gate stacks 30 also have lengthwise directions perpendicular to the lengthwise directions of protruding fins 24'.

Next, gate spacers 38 are formed on the sidewalls of dummy gate stacks 30. In accordance with some embodiments of the present disclosure, gate spacers 38 are formed of a dielectric material such as silicon nitride, silicon oxide, silicon carbo-nitride, silicon oxynitride, silicon oxy carbo-nitride, or the like, and may have a single-layer structure or a multi-layer structure including a plurality of dielectric layers.

Figure 4:
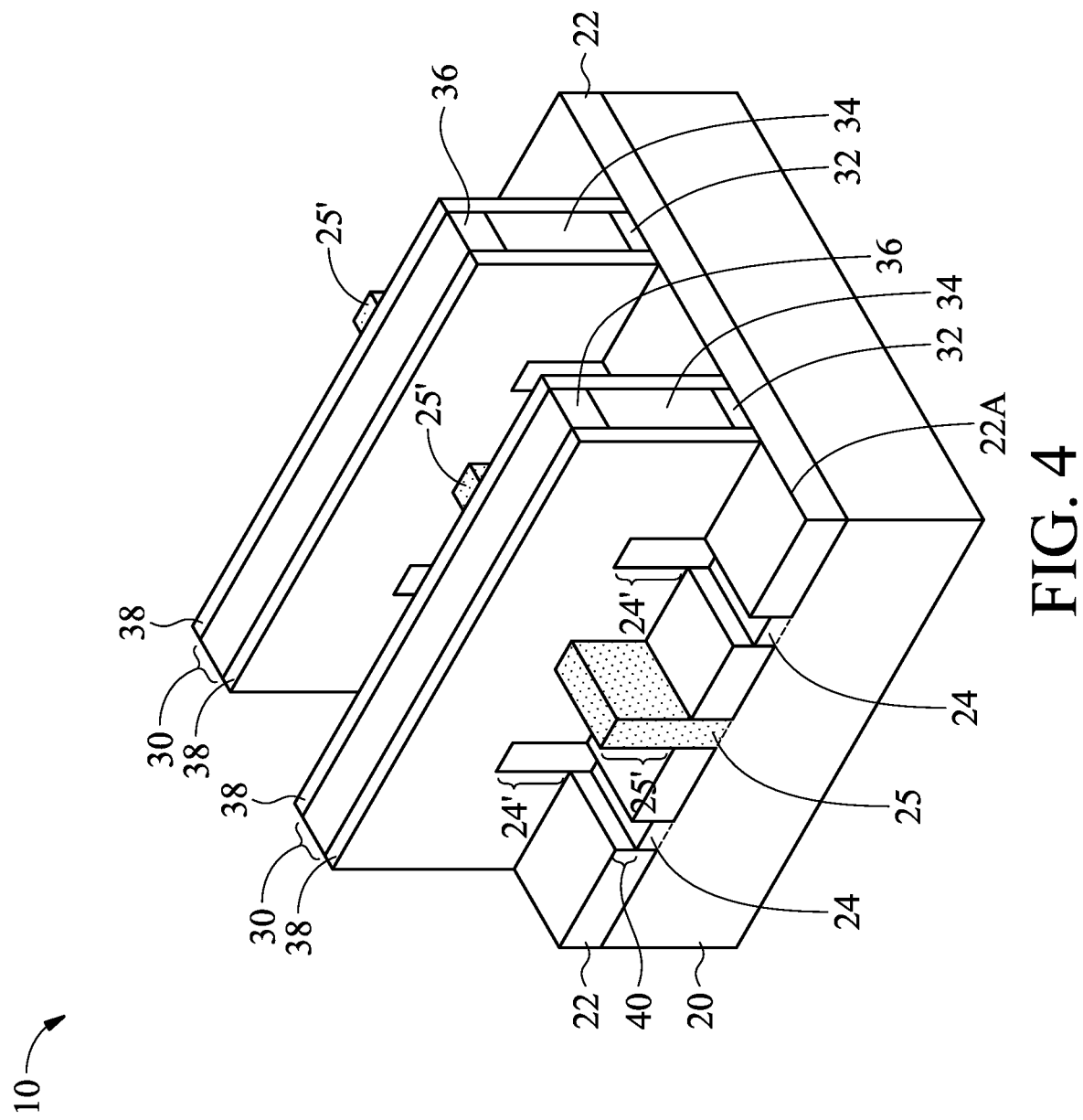

In accordance with some embodiments of the present disclosure, an etching step (referred to as source/drain recessing hereinafter) is performed to etch the portions of protruding fins 24' that are not covered by dummy gate stack 30 and gate spacers 38, resulting in the structure shown in FIG. 4. The respective process is illustrated as process 210 in the process flow 200 as shown in FIG. 21. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. The spaces left by the etched portions of protruding fins 24' are referred to as recesses 40. In the etching process, dielectric dummy fin 25' is not etched. For example, protruding fins 24' may be etched using SiCONi ($NF_3$ and $NH_3$), HF and $NH_3$, or the like.

Figure 5A:
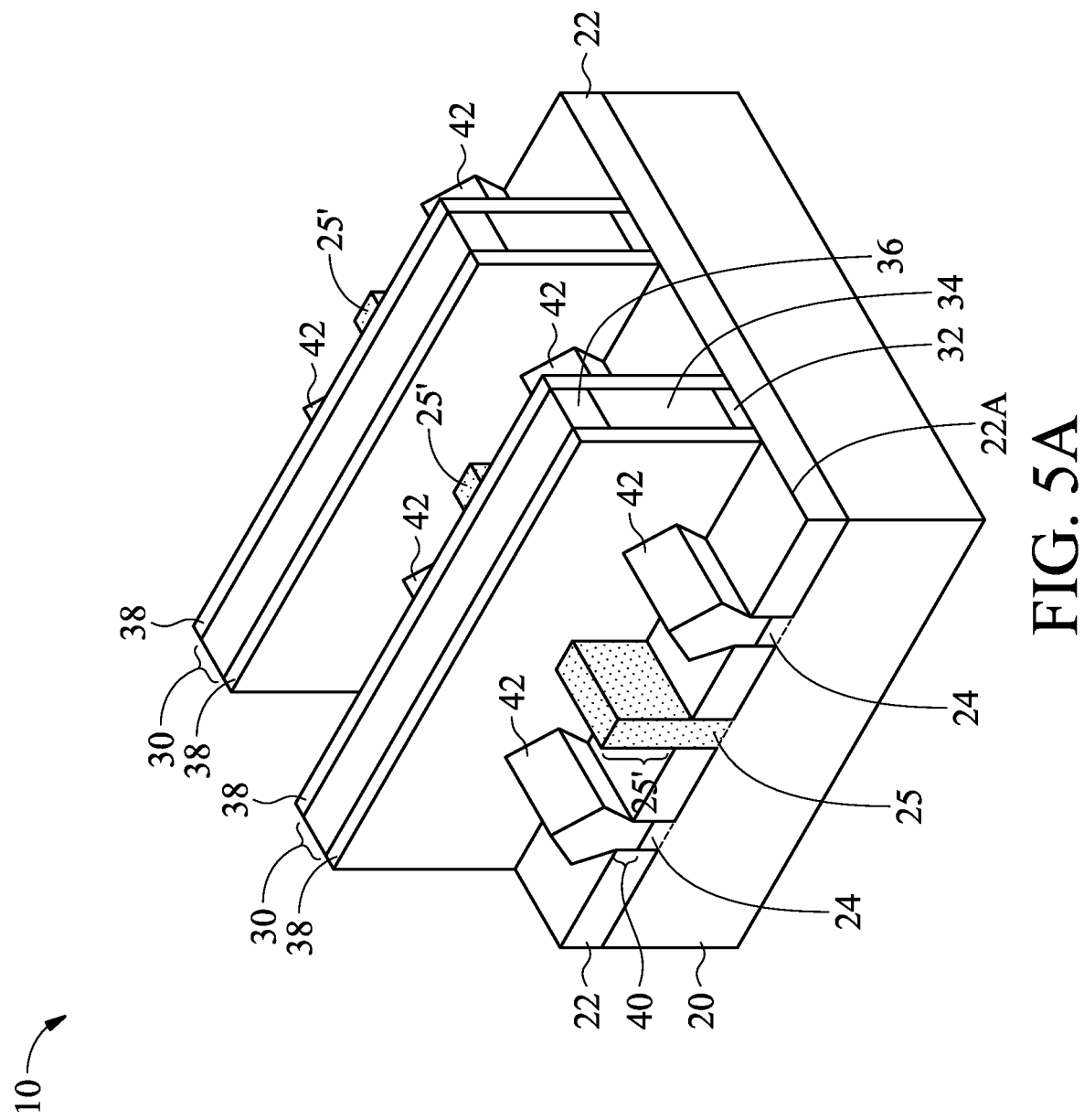

Next, epitaxy regions (source/drain regions) 42 are formed by selectively growing a semiconductor material from recesses 40, resulting in the structure in FIG. 5A. The respective process is illustrated as process 212 in the process flow 200 as shown in FIG. 21. In accordance with some embodiments, epitaxy regions 42 include silicon germanium, silicon, silicon carbon, or the like. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), GeB, or the like may be grown. Conversely, when the resulting FinFET is an n-type FinFET, silicon phosphorous (SiP), silicon carbon phosphorous (SiCP), or the like, may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 start expanding horizontally, and facets may be formed.

Figure 5B:
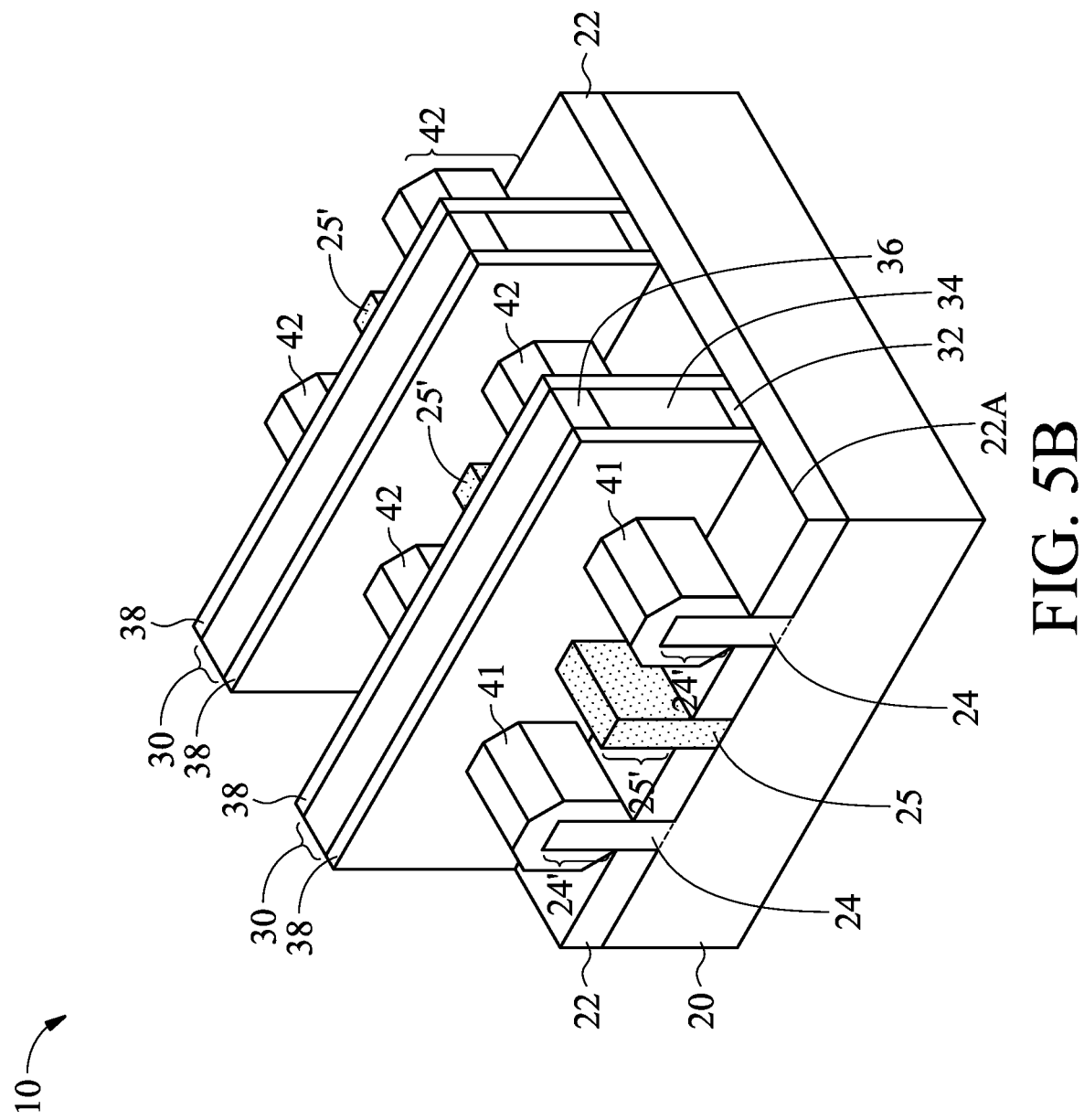

FIG. 5B illustrates the formation of cladding source/drain regions 42 in accordance with alternative embodiments of the present disclosure. In accordance with these embodiments, the protruding fins 24' as shown in FIG. 4 are not recessed, and epitaxy regions 41 are grown on protruding fins 24'. The material of epitaxy regions 41 may be similar to the material of the epitaxy semiconductor material 42 as shown in FIG. 5A, depending on whether the resulting FinFET is a p-type or an n-type FinFET. Accordingly, source/drains 42 include protruding fins 24' and the epitaxy region 41. An implantation may (or may not) be performed to implant an n-type impurity or a p-type impurity.

Figure 6:
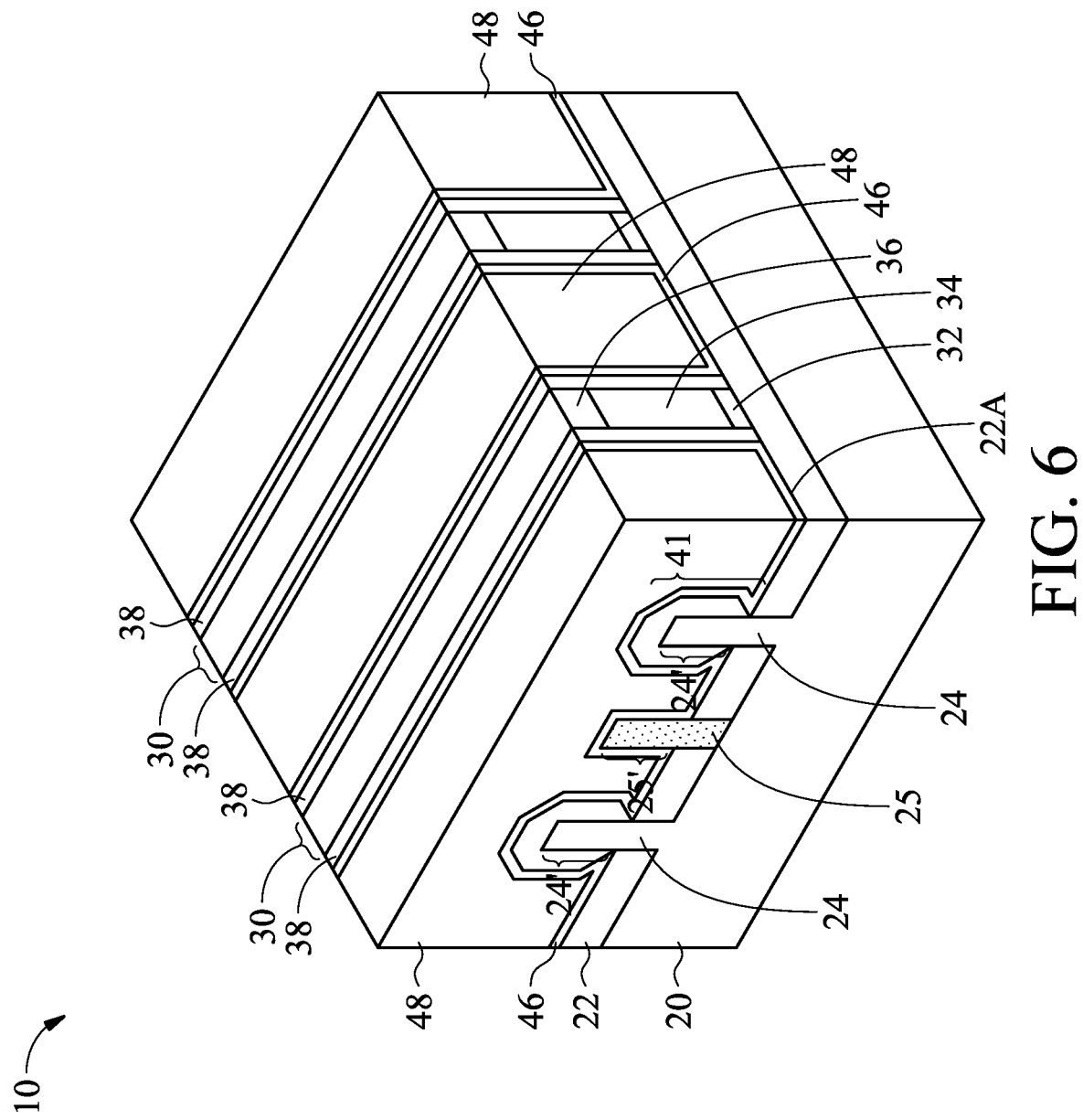

FIG. 6 illustrates a perspective view of the structure after the formation of Contact Etch Stop Layer (CESL) 46 and Inter-Layer Dielectric (ILD) 48. The respective process is illustrated as process 214 in the process flow 200 as shown in FIG. 21. CESL 46 may be formed of silicon nitride, silicon carbo-nitride, or the like. CESL 46 may be formed using a conformal deposition method such as ALD or CVD, for example. ILD 48 may include a dielectric material formed using, for example, FCVD, spin-on coating, CVD, or another deposition method. ILD 48 may also be formed of an oxygen-containing dielectric material, which may be silicon-oxide based such as silicon oxide, Phospho-Silicate Glass (PSG), Boro-Silicate Glass (BSG), Boron-Doped Phospho-Silicate Glass (BPSG), or the like. A planarization process such as Chemical Mechanical Polish (CMP) process or mechanical grinding process is performed to level the top surfaces of ILD 48, dummy gate stacks 30, and gate spacers 38 with each other.

Figure 7:
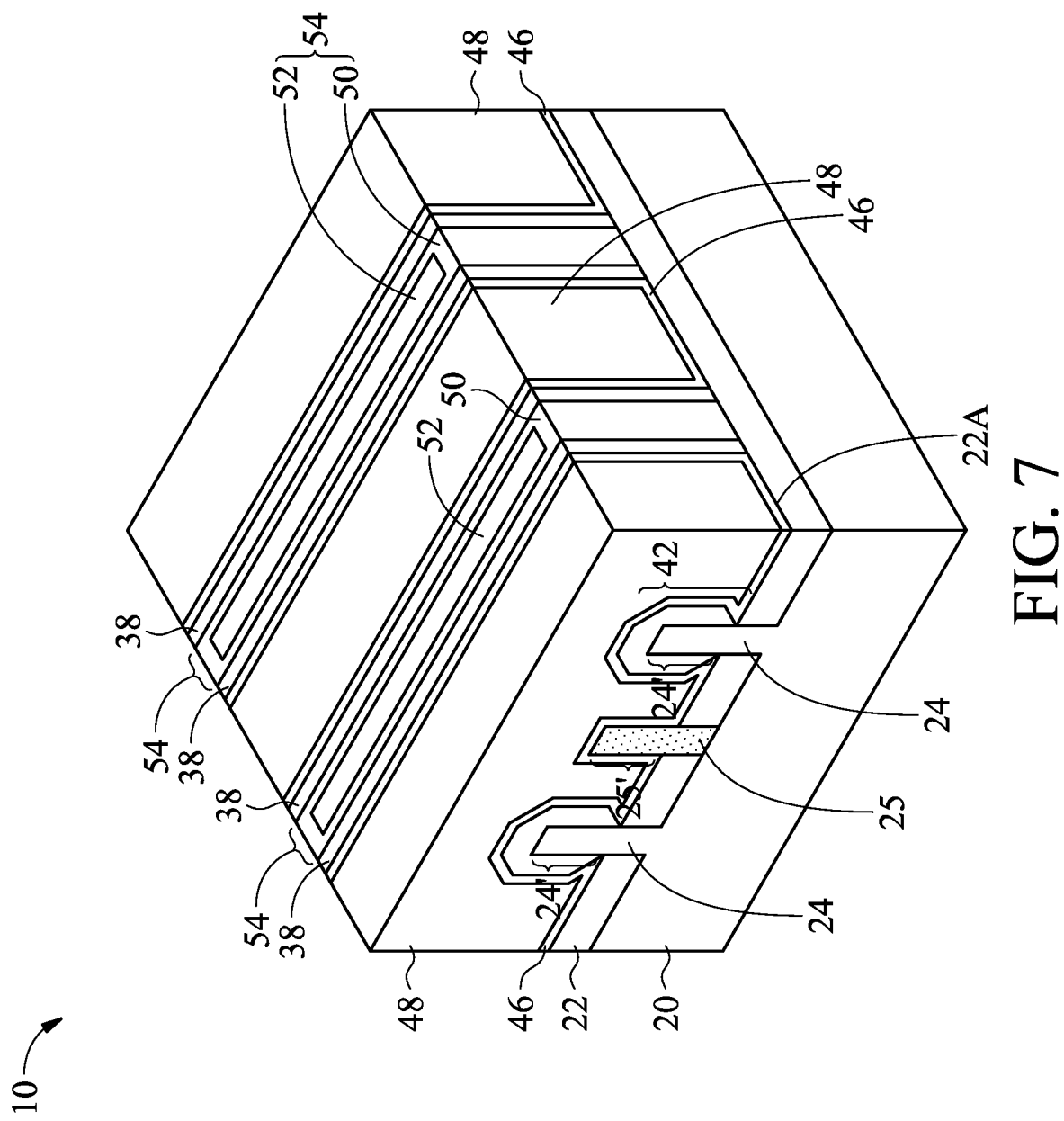

Next, dummy gate stacks 30, which include hard mask layers 36, dummy gate electrodes 34 and dummy gate dielectrics 32, are replaced with replacement gate stacks 54, as shown in FIG. 7. In accordance with some embodiments of the present disclosure, the replacement includes etching hard mask layers 36, dummy gate electrodes 34, and dummy gate dielectrics 32 as shown in FIG. 6 in one or a plurality of etching steps, resulting in openings to be formed between gate spacers 38. The respective process is illustrated as process 216 in the process flow 200 as shown in FIG. 21. Next, as shown in FIG. 7, (replacement) gate stacks 54 are formed, which include gate dielectric layers 50 and gate electrodes 52. The respective process is illustrated as process 218 in the process flow 200 as shown in FIG. 21. The formation of gate stacks 54 includes forming/depositing a plurality of layers, and then performing a planarization process such as a CMP process or a mechanical grinding process. In accordance with some embodiments of the present disclosure, each of gate dielectric layers 50 includes an Interfacial Layer (IL) as its lower part. The IL is formed on the exposed surfaces of protruding fins 24'. The IL may include an oxide layer such as a silicon oxide layer, which is formed through the thermal oxidation of protruding fins 24', a chemical oxidation process, or a deposition process. Each of gate dielectric layers 50 may also include a high-k dielectric layer formed over the IL. Accordingly, gate dielectric layers 50 are alternatively referred to as high-k dielectric layers, although they may include ILs. The high-k dielectric layer may include a high-k dielectric material such as $HfO_2$, $ZrO_2$, $HfZrO_x$, $HfSiO_x$, $HfSiON$, $ZrSiO_x$, $HfZrSiO_x$, $Al_2O_3$, $HfAlO_x$, $HfAlN$, $ZrAlO_x$, $La_2O_3$, $TiO_2$, $Yb_2O_3$, silicon nitride, or the like. The dielectric constant (k-value) of the high-k dielectric material is higher than 3.9, and may be higher than about 7.0. The high-k dielectric layer may be formed as conformal layers, and extends on the sidewalls of protruding fins 24' and the sidewalls of gate spacers 38. Gate dielectric layers 50 also extend on the top surfaces and sidewalls of dielectric dummy fin 25', except there may not be IL formed on dielectric dummy fin 25' if IL is formed through thermal oxidation. Accordingly, the portion of gate dielectric layer 50 (including the IL and the high-k) on protruding fins 24' may be thicker than the portion of gate dielectric layer 50 on dielectric dummy fin 25'. In accordance with some embodiments of the present disclosure, high-k dielectric layers 50 are formed using ALD or CVD.

Gate electrodes 52 are formed on top of gate dielectric layers 50, and fill the remaining portions of the trenches left by the removed dummy gate stacks. The sub-layers in gate electrodes 52 are not shown in FIG. 7, while the sub-layers may be distinguishable from each other due to the difference in their compositions. The deposition of at least lower sub-layers may be performed using conformal deposition methods such as ALD or CVD, so that the thickness of the vertical portions and the thickness of the horizontal portions of gate electrodes 52 (and each of sub-layers) are substantially equal to each other.

The sub-layers in gate electrodes 52 may include, and is not limited to, a Titanium Silicon Nitride (TSN) layer, a tantalum nitride (TaN) layer, a titanium nitride (TiN) layer, a titanium aluminum (TiAl) layer, an additional TiN and/or TaN layer, and a filling metal region. Gate electrodes 52 are referred to as metal gates 52 hereinafter. Some of these sub-layers define the work function of the respective FinFET. Furthermore, the metal layers of a p-type FinFET and the metal layers of an n-type FinFET may be different from each other so that the work functions of the metal layers are suitable for the respective p-type or n-type FinFETs. The filling metal may include tungsten, cobalt, or the like.

Figure 8:
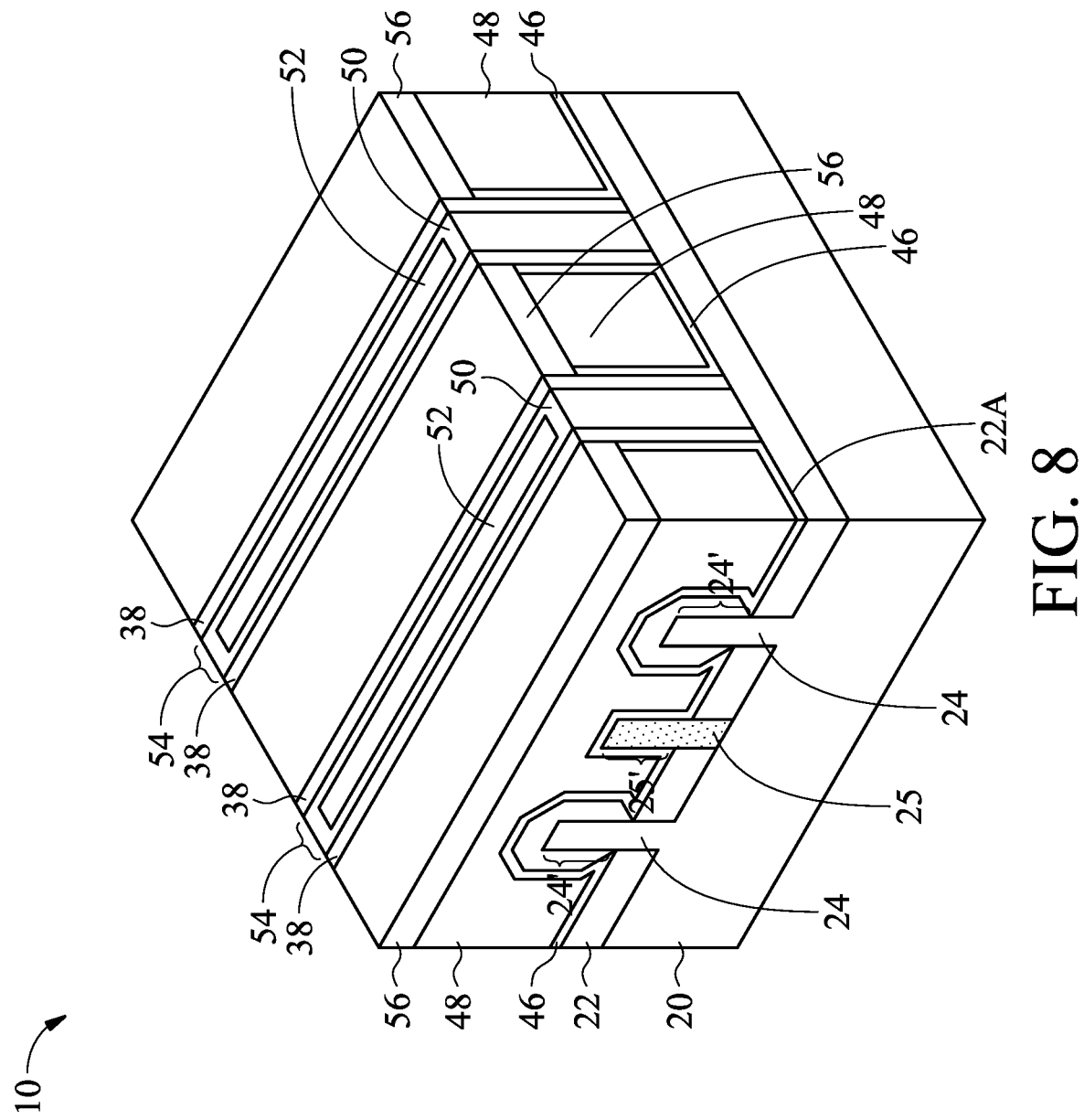

Next, as shown in FIG. 8, hard masks 56 are formed. The respective process is illustrated as process 220 in the process flow 200 as shown in FIG. 21. The material of hard masks 56 is different from that of ILD 48, so that hard mask 56 may protect ILD 48 in subsequent etching process (for example, as shown in FIG. 14C). In accordance with some embodiments of the present disclosure, the formation of hard masks 56 includes recessing ILD 48 (and possibly CESL 46) through etching to form recesses, filling a dielectric material into the recesses, and performing a planarization to remove the excess portions of the dielectric material. As shown in FIG. 8, metal gate may be recessed slightly, or may not be recessed, during the recessing of ILD 48. In the recessing of ILD 48, CESL 46 may (as shown in FIG. 8) or may not be recessed. The remaining portions of the filling dielectric material are hard masks 56. In accordance with some embodiments, hard masks 56 are formed of silicon nitride, silicon oxynitride, silicon oxy-carbide, silicon oxycarbo-nitride, or the like.

Figure 9:
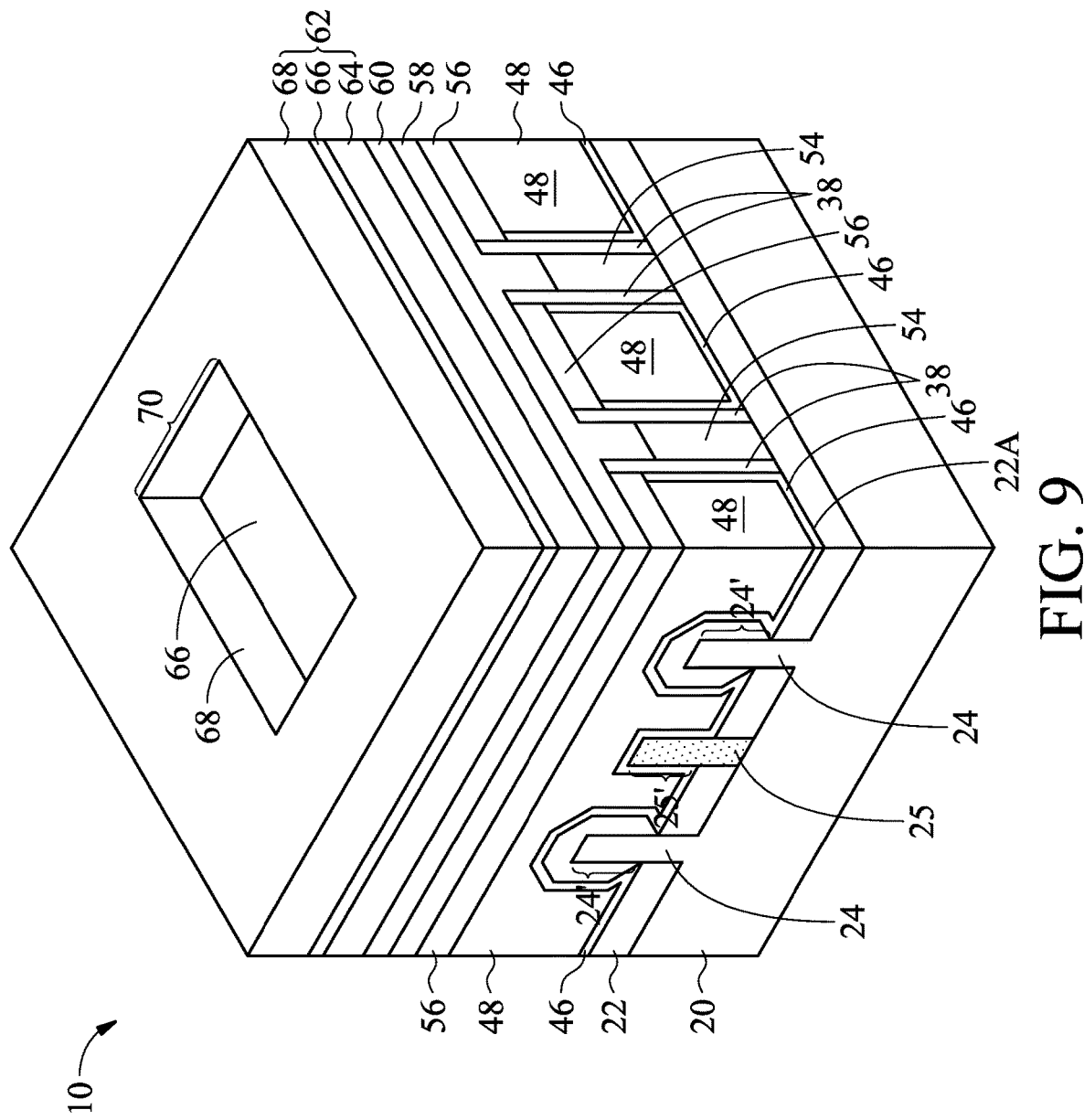

Next, as shown in FIG. 9, hard mask 58 is formed. The respective process is illustrated as process 222 in the process flow 200 as shown in FIG. 21. Hard mask 58 may be formed of amorphous silicon, zirconium oxide ($ZrO_2$), or the like. In accordance with some embodiments of the present disclosure, the formation of hard mask 58 includes recessing gate stacks 54 through etching to form recesses, depositing hard mask 58 into the recesses, and performing a planarization process to planarize the top surface of hard mask 58. Hard mask 58 may include some portions overlapping and contacting gate electrodes 52 and hard masks 56. Over hard masks 58, hard mask 60 is formed, which may be formed of silicon nitride, silicon oxynitride, silicon oxy-carbide, silicon oxy carbo-nitride, or the like.

Tri-layer etching mask 62 is formed over hard mask 60. The respective process is illustrated as process 224 in the process flow 200 as shown in FIG. 21. Etching mask 62 may include under layer 64, middle layer 66, and upper layer 68. Under layer 64 may be formed of cross-linked photo resist. Middle layer 66 may be formed of an inorganic material such as silicon oxynitride or the like. Upper layer 68 may be formed of photo resist, which is exposed and developed to form opening 70. Opening 70 overlaps dielectric dummy fin 25'.

Next, the middle layer 66 and under layer 64 are etched to extend opening 70 downwardly. The remaining portions of tri-layer etching mask 62 is then used to etch the underlying hard mask 60 so that opening 70 extends into hard mask 60. Tri-layer etching mask 62 may be partially consumed in this process, and the remaining portions of tri-layer etching mask 62 are then removed using, for example, ashing or etching. The resulting structure is shown in FIG. 10A, which illustrates the opening 70 in hard mask 60.

Figure 10A:
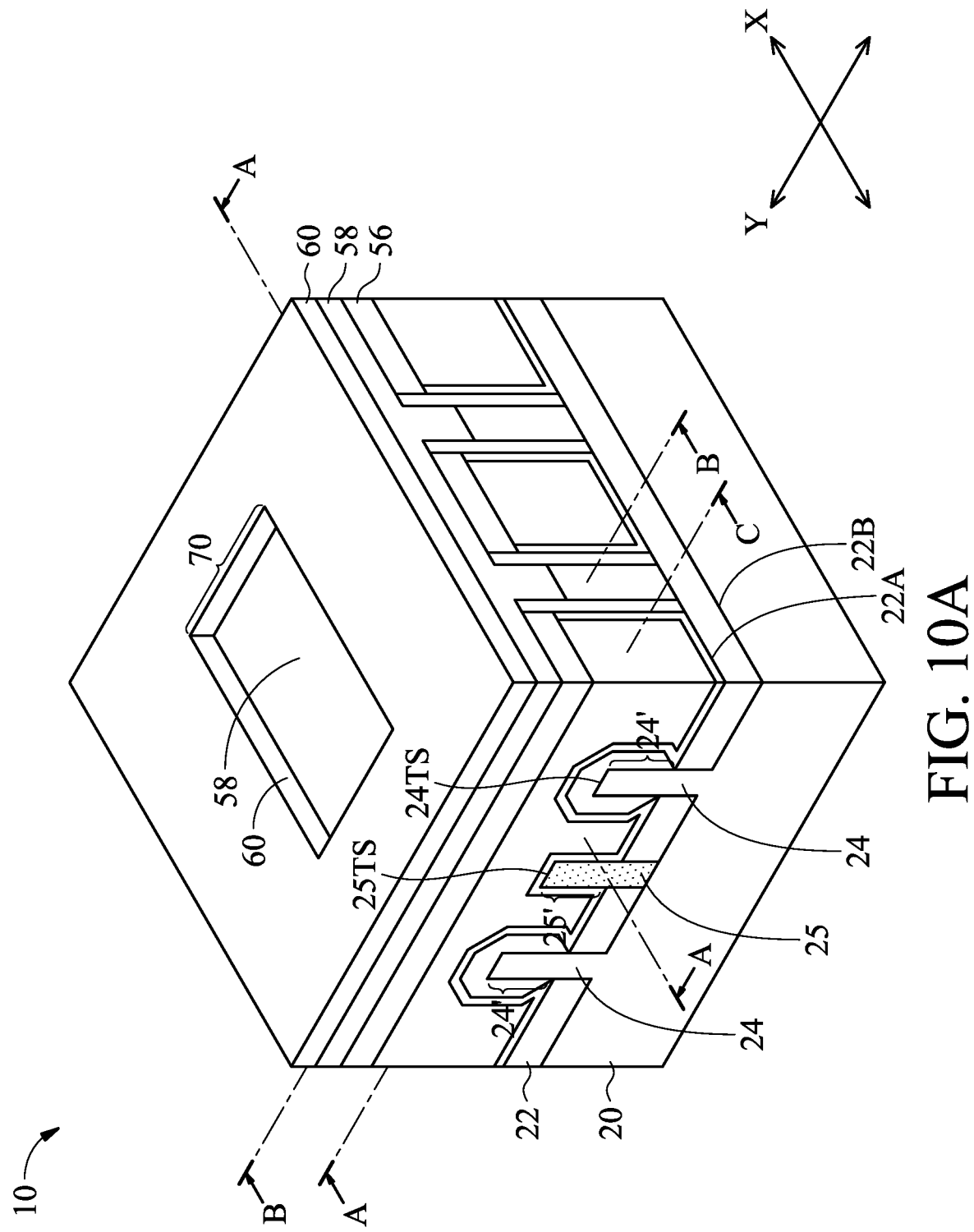
Figure 10B:
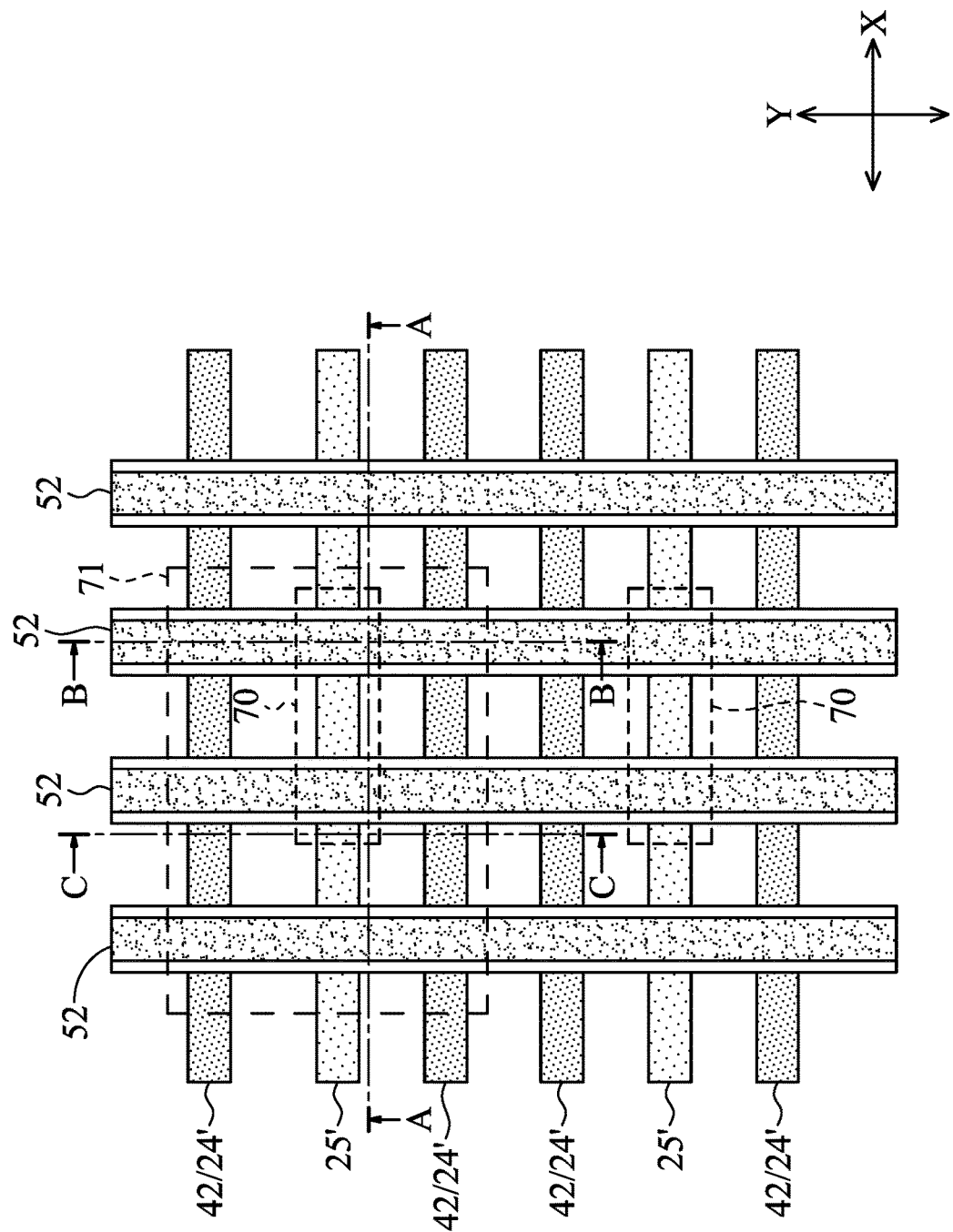

FIG. 10B illustrates a plane view of some protruding fins 24', dielectric dummy fins 25', and metal gates 52. The protruding fins 24' may be directly underlying metal gates 52, and source/drain regions 42 are formed between metal gates 52. Protruding fins 24' and source/drain regions 42 are aligned to straight lines that are parallel to each other, which straight lines are in the X-direction. A plurality of metal gates 52 are formed as strips that are parallel to each other, and are in the Y-direction. The X-direction and the Y-direction are also shown in FIG. 10A. Also, the perspective view shown in FIG. 10A illustrates the region 71 in FIG. 10B.

The subsequent FIGS. 11A, 11B, 11C, 12A, 12B, 12C, 13A, 13B, 13C, 14A, 14B, 14C, 14D, 15A, 15B, 16A, 16B, and 16C illustrate a process for cutting metal gates 52 in accordance with some embodiments. In these figures, the figure numbers may include letter "A," letter "B," or letter "C." The letter "A" indicates that the respective figure is a cross-sectional view obtained from the vertical plane same as the vertical plane containing line A-A in FIGS. 10A and 10B. The letter "B" indicates that the respective figures (except FIG. 15B) are obtained from the vertical plane same as the vertical plane containing line B-B in FIGS. 10A and 10B, which vertical plane cuts into metal gates 52. The letter "C" indicates that the respective figures are obtained from the vertical planes same as the vertical plane containing line C-C in FIGS. 10A and 10B, which vertical plane cuts through source/drain regions 42.

Figure 11A:
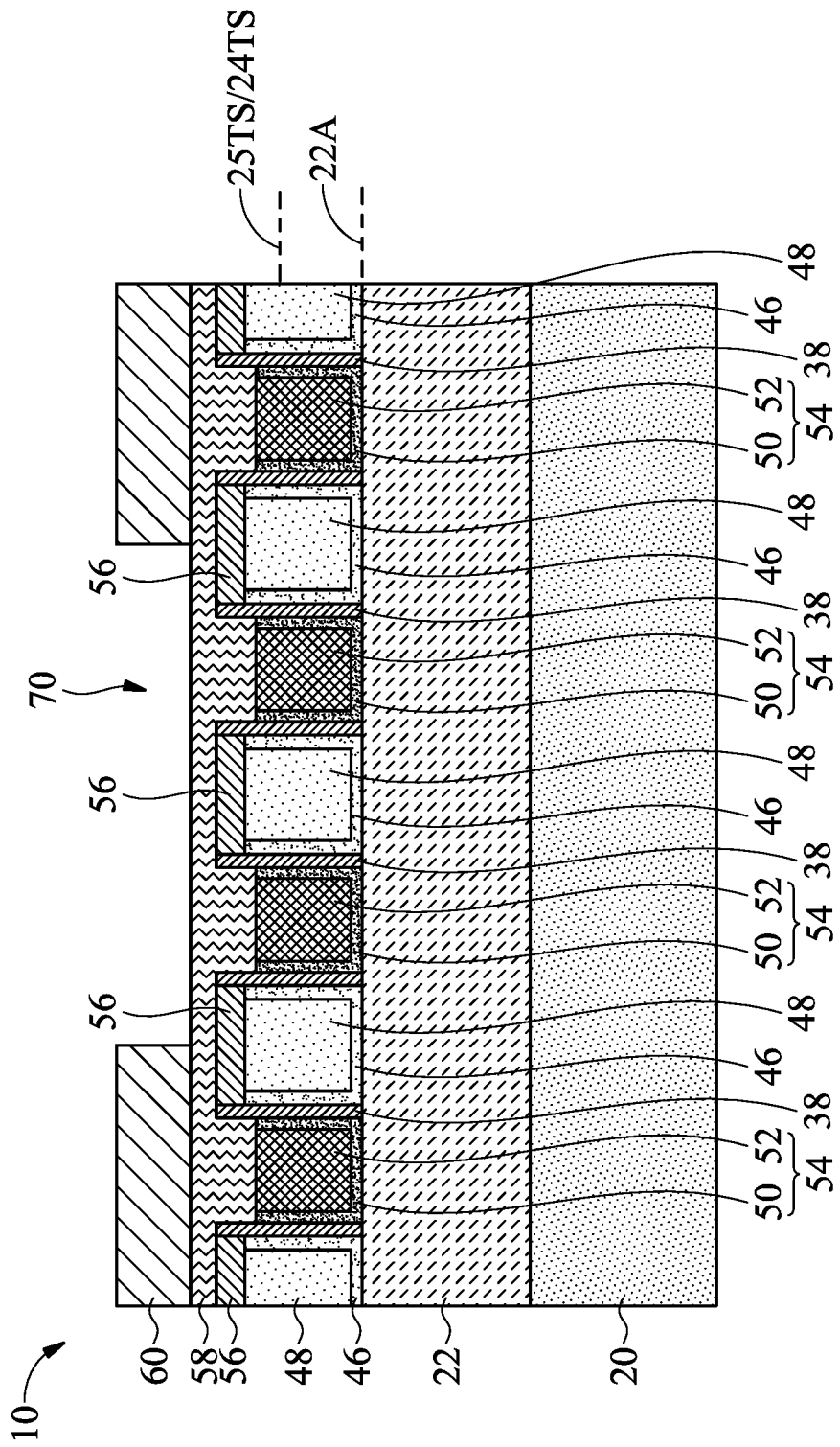
Figure 11B:
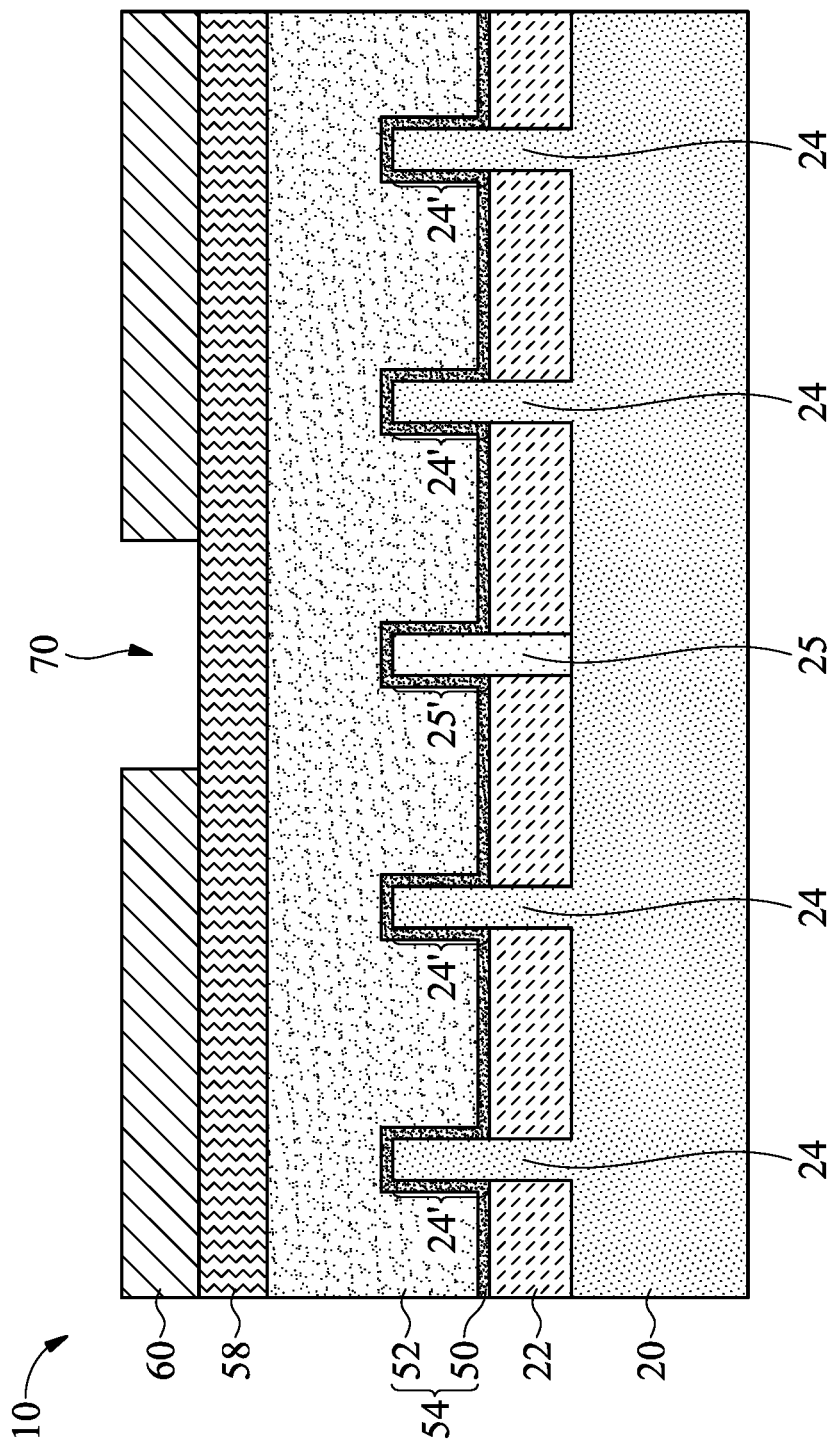
Figure 11C:
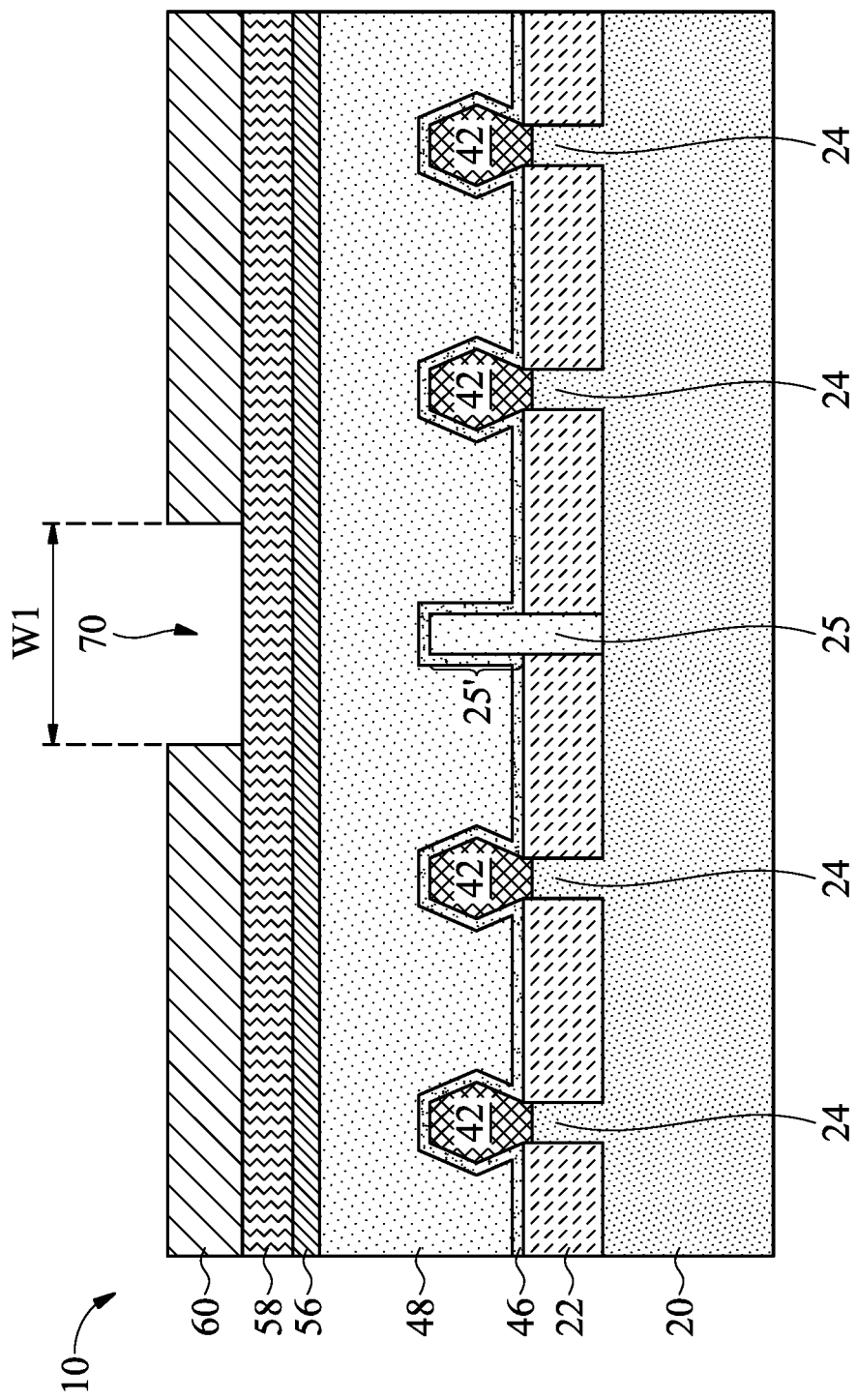

FIGS. 11A, 11B, and 11C illustrate the cross-sectional views obtained from the vertical reference cross-section A-A, B-B, and C-C, respectively, in FIGS. 10A and 10B. As shown in FIG. 11A, some portions of metal gates 52, ILD 48, and hard masks 56 are directly underlying opening 70. The levels of the top surface 25TS/24TS of dielectric dummy fin 25' and semiconductor fins 24' are illustrated to show where dielectric dummy fin 25' and semiconductor fins 24' are located, which are higher than top surface 22A of STI regions 22 and lower than the respective top surfaces 25TS and 24TS. FIG. 11B illustrates that opening 70 overlaps a portion of dielectric dummy fin 25', and extends laterally beyond the opposite edges of dielectric dummy fin 25'. In the illustrated example embodiments, the portion of the metal gate 52 on the left side of dielectric dummy fin 25' is used to form a first gate electrode of a first FinFET, and the portion of the metal gate 52 on the right side of dielectric dummy fin 25' is used to form a second gate electrode of a second FinFET. The continuous metal gate 52 as shown in FIG. 11B will be cut apart into the first gate electrode and the second gate electrode in subsequent processes.

Figure 12A:
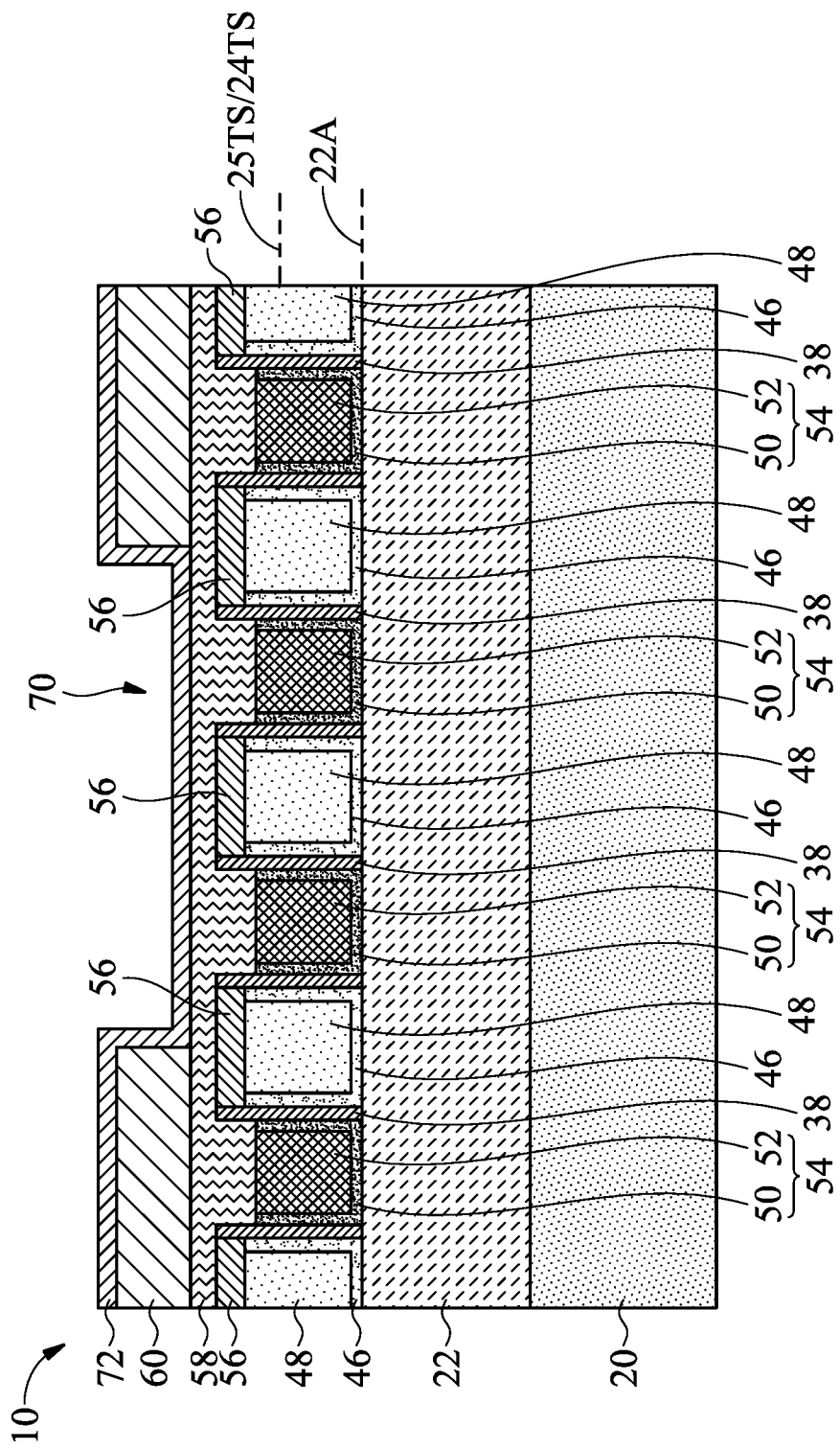
Figure 12B:
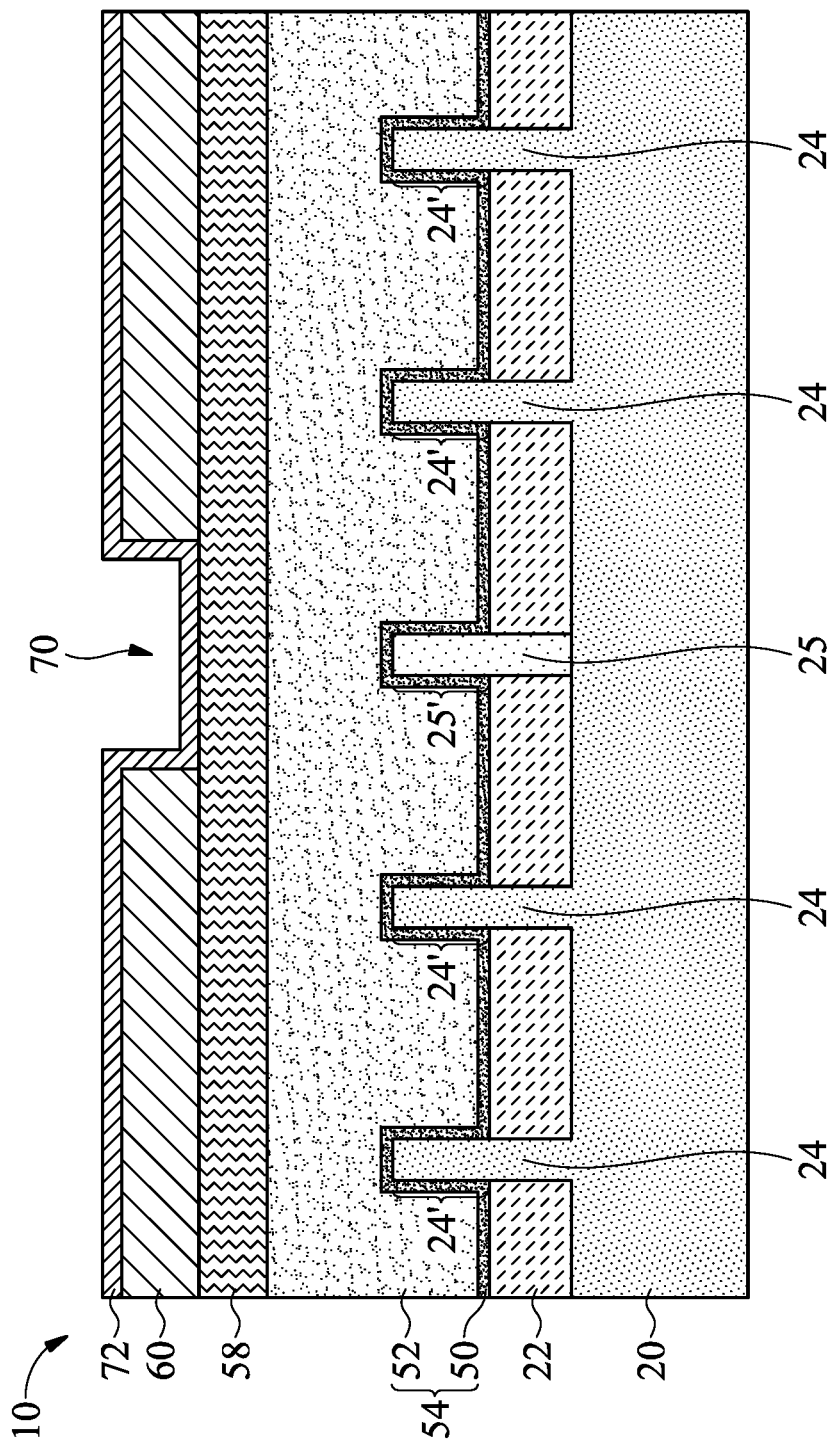
Figure 12C:
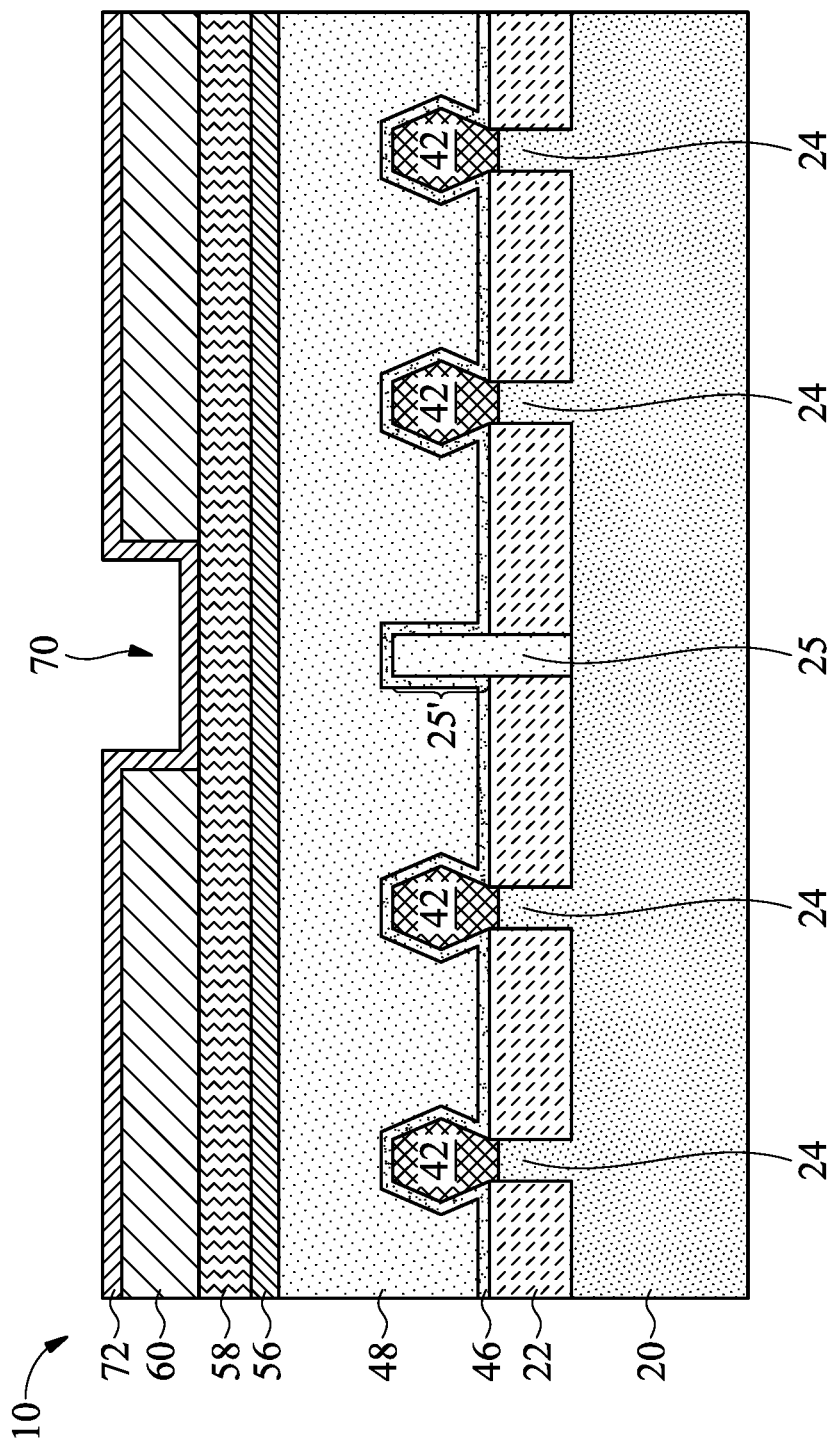

FIGS. 12A, 12B, 12C, 13A, 13B, and 13C illustrate the cross-sectional views of the processes for narrowing opening 70. Due to the limitation of the lithography process, the width W1 of opening 70 (FIG. 11C) may not be able to be formed small enough. Accordingly, as shown in FIGS. 12A, 12B, and 12C, conformal mask layer 72 is formed to extend into opening 70. Conformal mask layer 72 may be formed of a material same as or different from that of hard mask 60, and may be formed of or comprise silicon nitride, silicon oxynitride, silicon oxy-carbide, silicon oxy carbo-nitride, or the like.

Figure 13A:
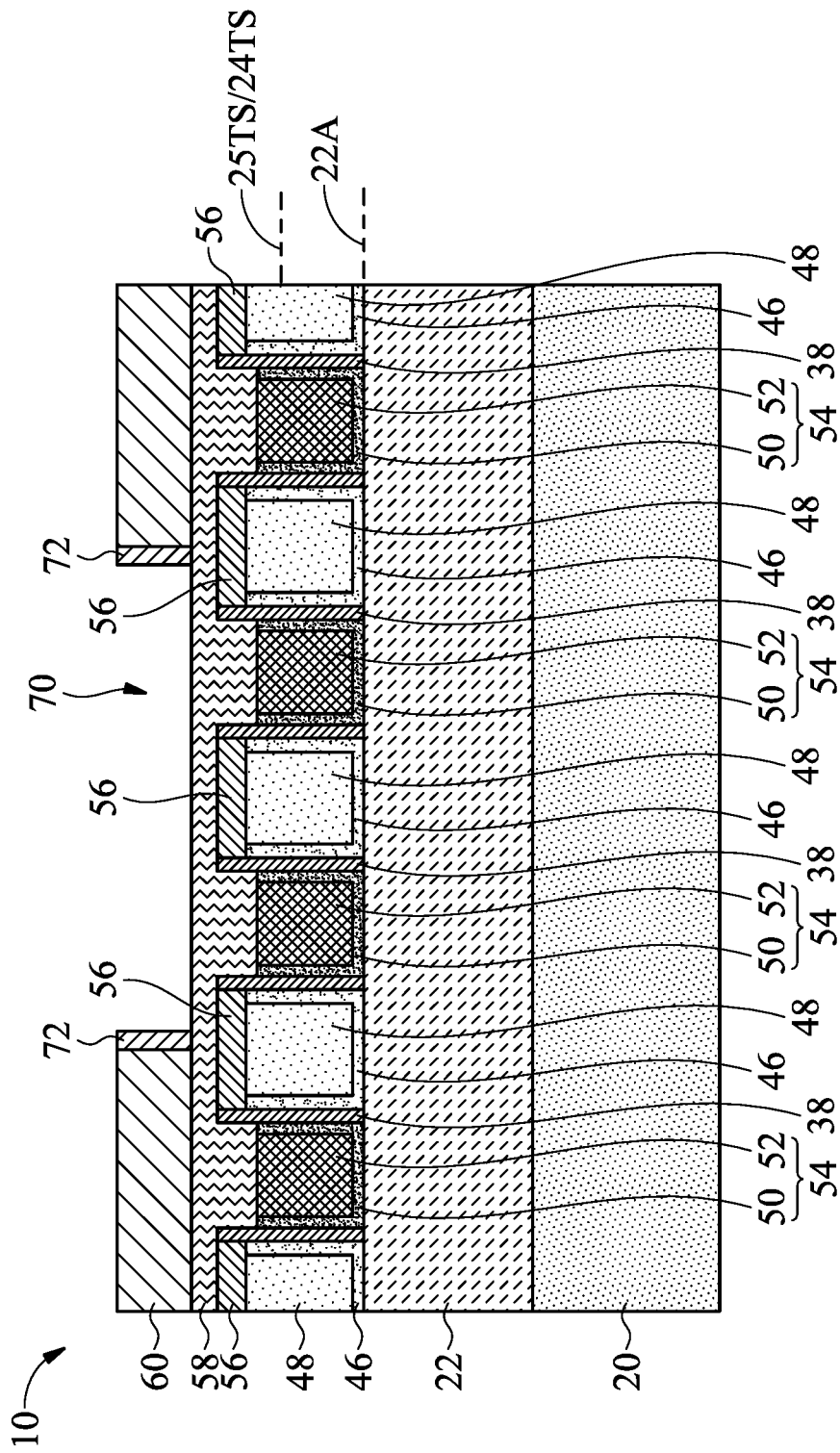
Figure 13B:
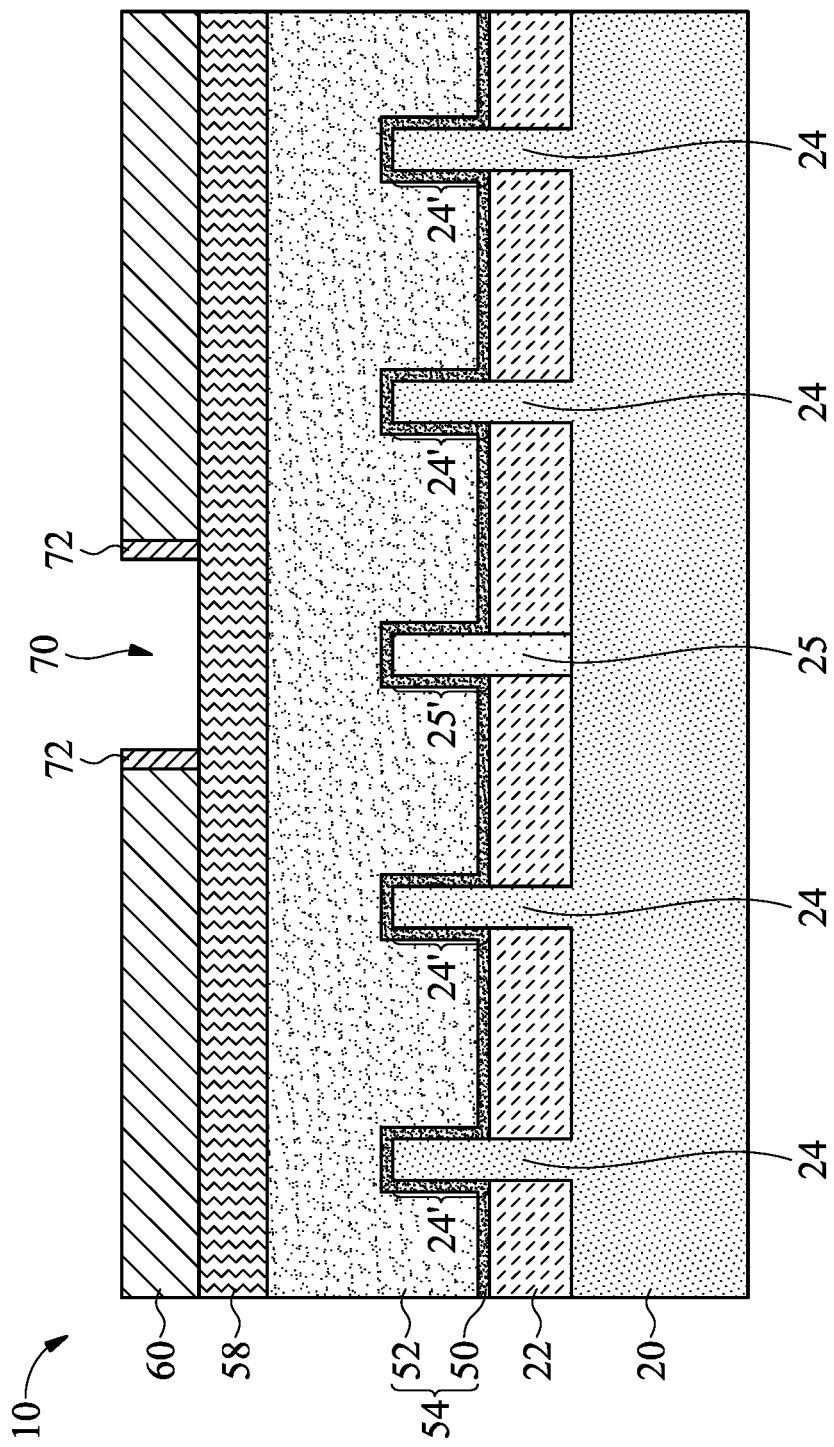
Figure 13C:
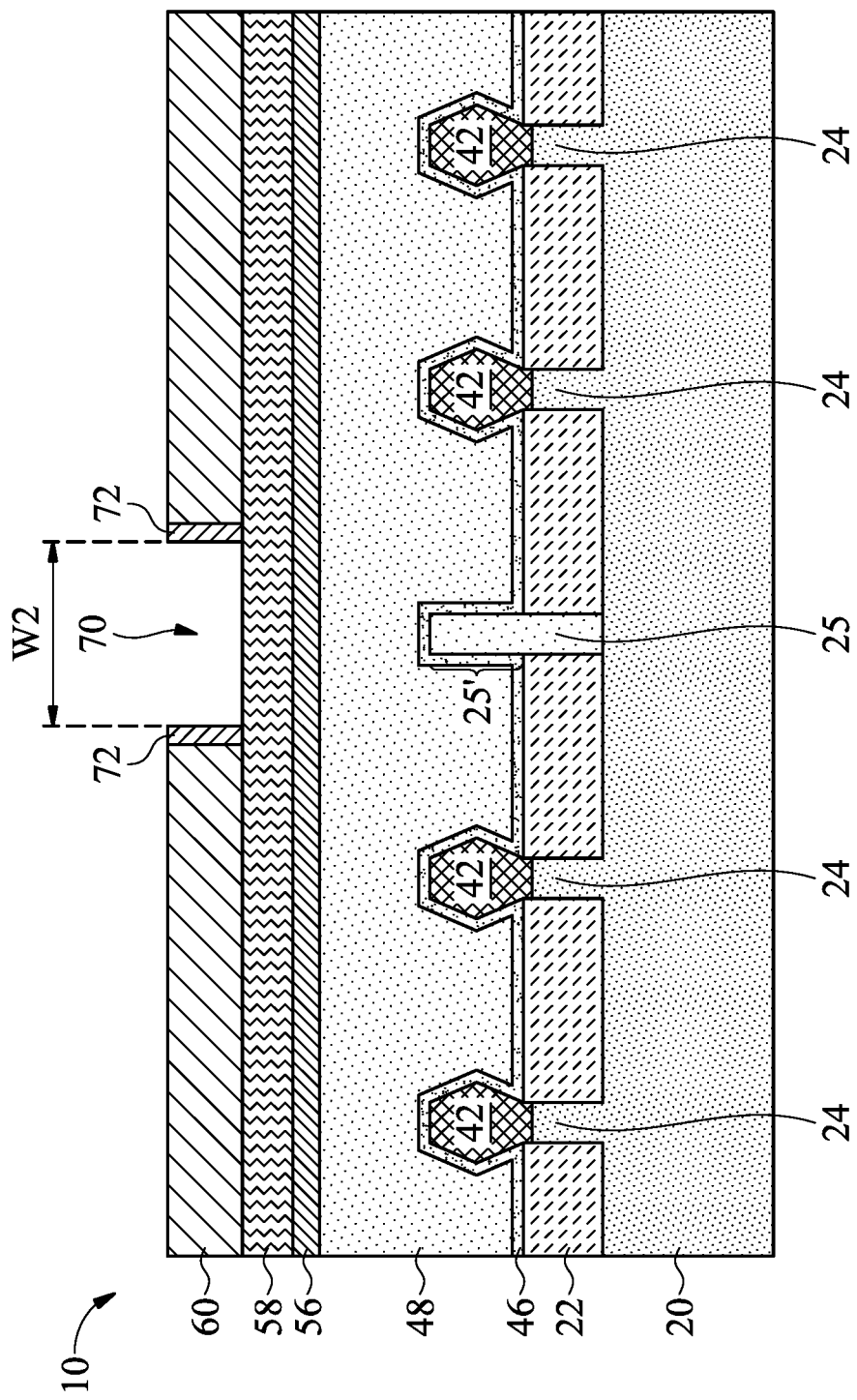

Next, as shown in FIGS. 13A, 13B, and 13C, an anisotropic etching process is performed to etch conformal mask layer 72. The horizontal portions of mask layer 72 are removed. The remaining portions of mask layer 72 in opening 70 are left on the sidewalls of hard mask 60. The width W2 of opening 70 is thus smaller than the width W1 of opening 70 in FIG. 11C.

Figure 14A:
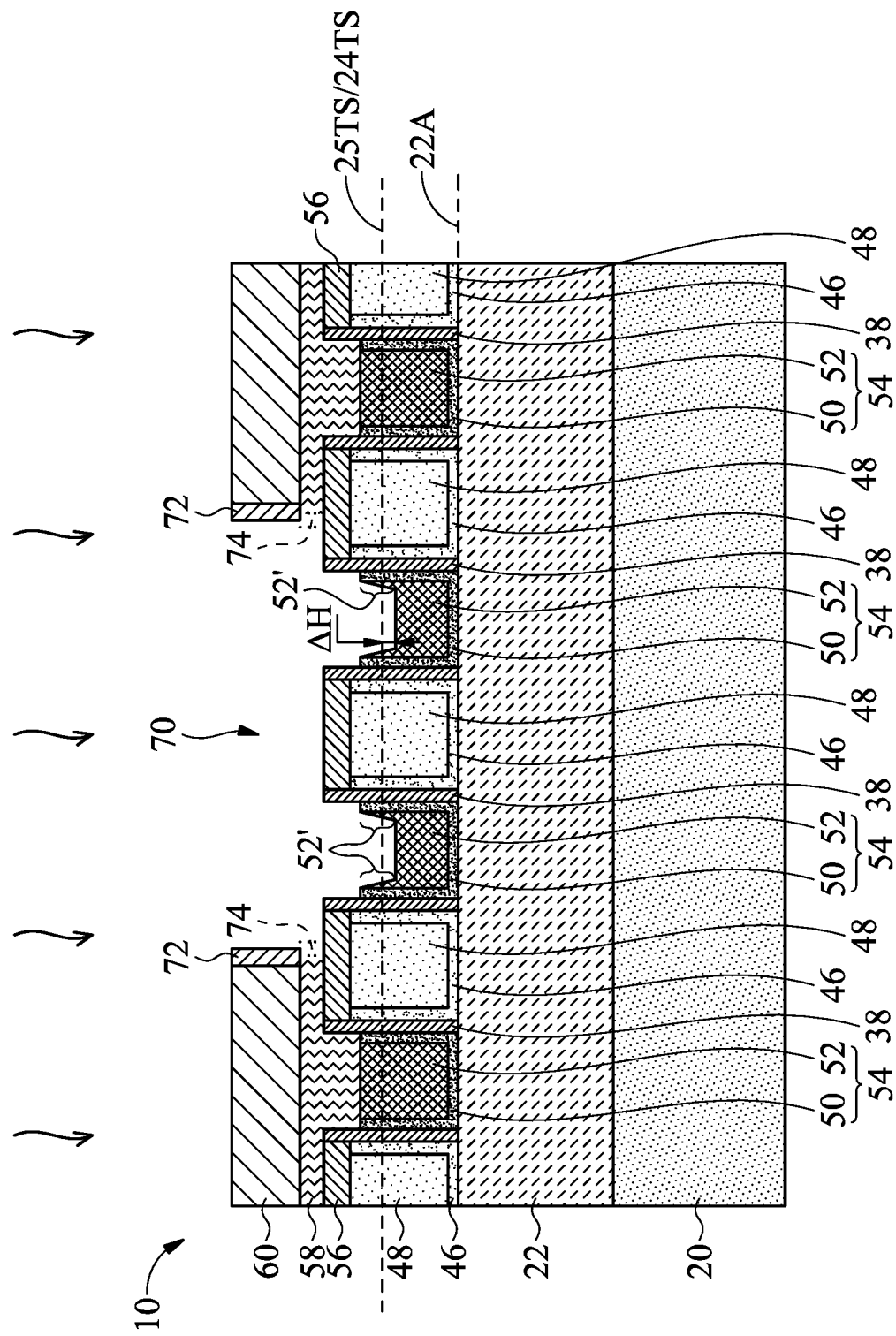
Figure 14B:
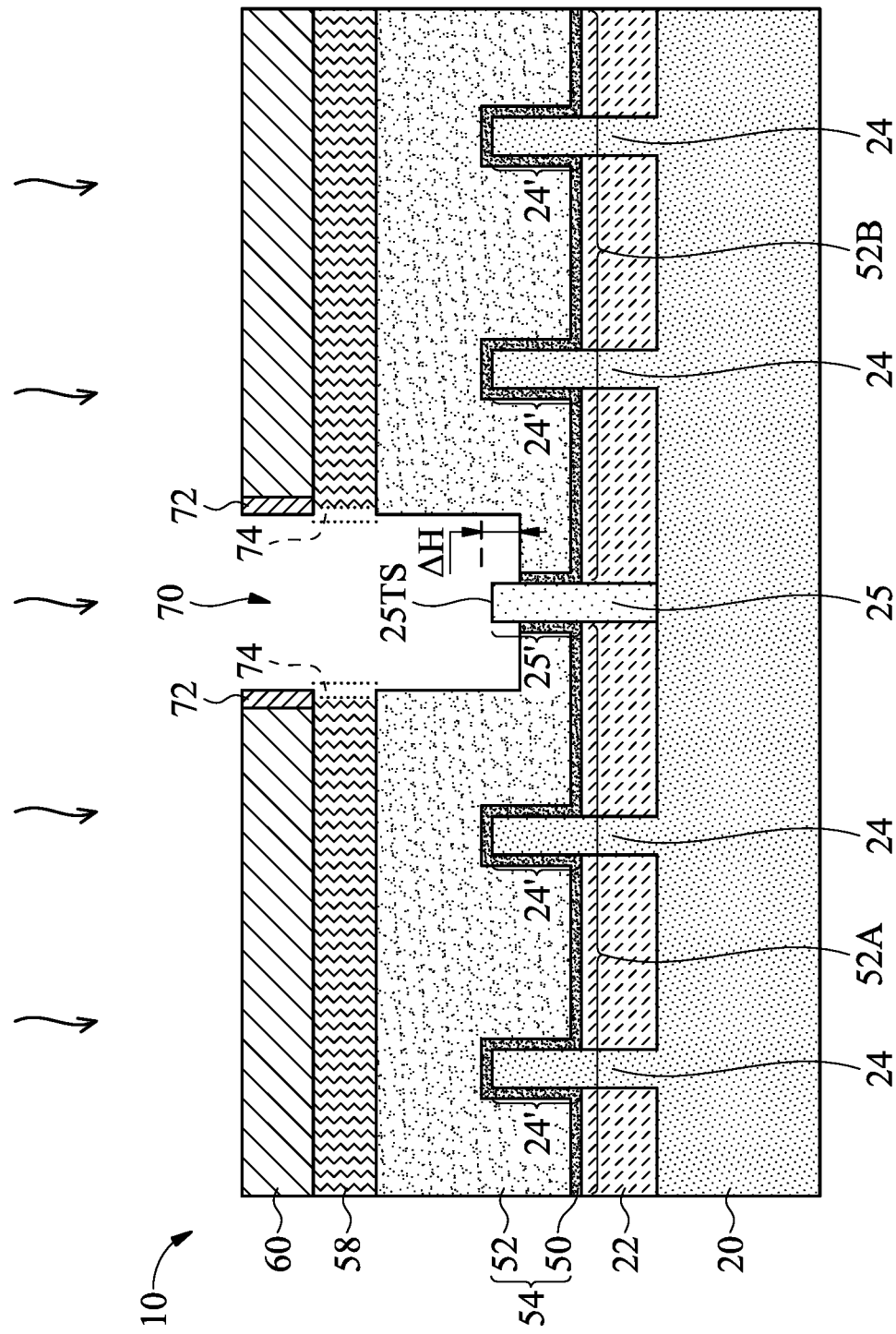
Figure 14C:
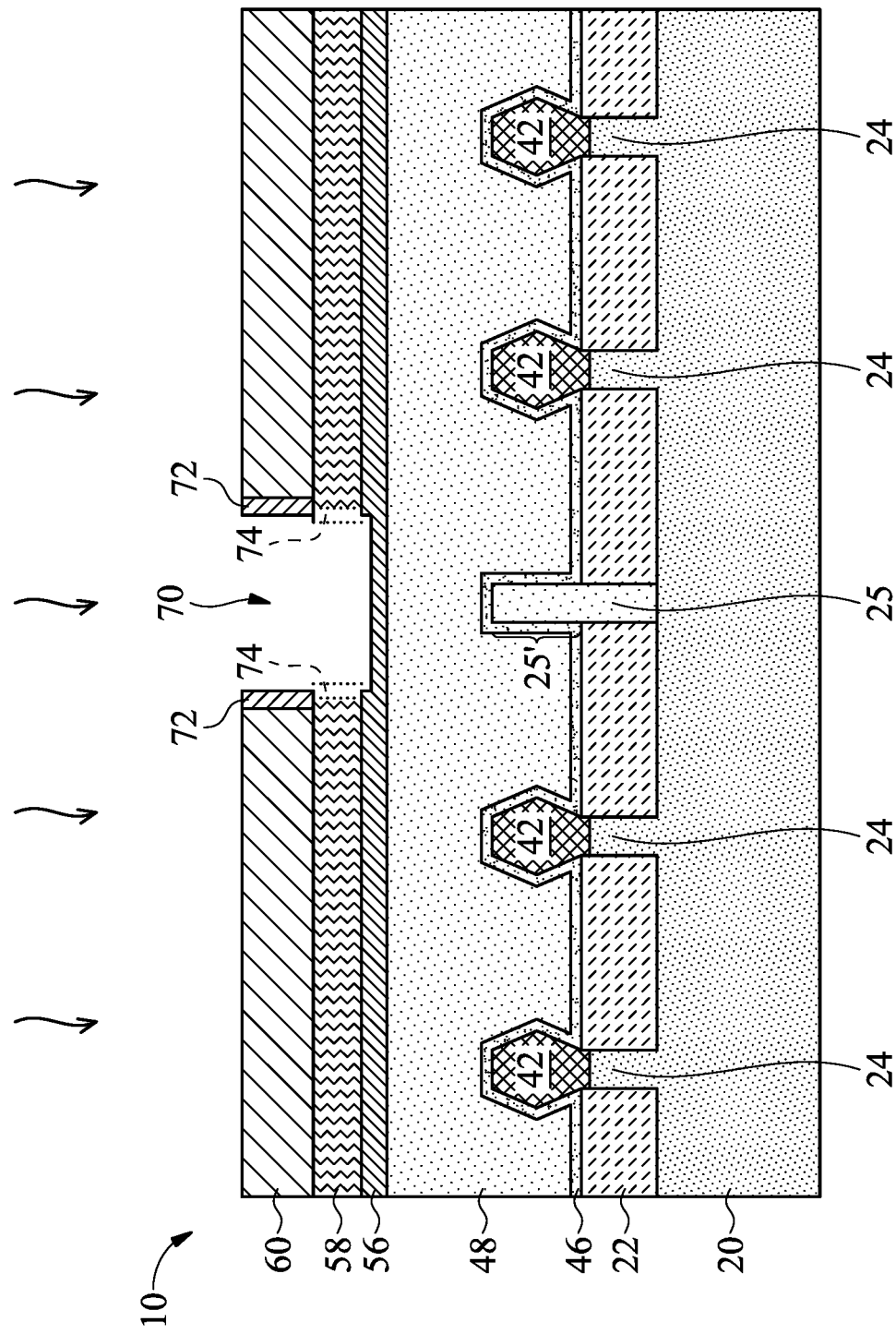

Referring to FIGS. 14A, 14B, and 14C, hard mask 58 is etched using hard mask 60 and mask layer 72 as an etching mask. The respective process is also illustrated as process 226 in the process flow 200 as shown in FIG. 21. As a result, metal gates 52 are exposed. Hard mask 56 is not etched in this process. The exposed metal gates 52 are then etched, as shown in FIG. 14A. The respective process is illustrated as process 228 in the process flow 200 as shown in FIG. 21. The etching may be performed using process gases selected from, and not limited to, chlorine-based and/or fluorine-based gases. For example, the etching gas may include $Cl_2$, $BCl_3$, $CH_4$, $CF_4$, $CHF_3$, $CH_2F_2$, $H_2$, or combinations thereof. A carrier gas such as Ar or He may be added. In accordance with some embodiments, oxygen ($O_2$) is added into the etching gas to oxidize the portions of metal gates 52 that are being etched. The etching may be performed with a pressure in the range between about 3 mTorr and about 10 mTorr. Plasma is generated in the etching, and a proper bias voltage is applied so that the etching is anisotropic. An RF power is applied, and the RF power may be in the range between about 500 Watts and about 900 Watts. After the metal gates 52 are etched-through as shown in FIG. 14B, high-k dielectric layer 50 is exposed, which is also etched-through, and dielectric dummy fin 25' is exposed.

As shown in FIG. 14C, in the etching of hard mask 58, the etching may be stopped on hard mask 56, which has a higher etching selectivity (relative to hard mask 58) than ILD 48. Accordingly, the etching may be effective stopped. Otherwise, if hard mask 56 is not formed, after hard mask 58 is etched-through, since the etching rate of ILD 48 may not be low enough, ILD 48 may be significantly damaged. For example, the loss of hard mask 56 in the etching is less than about 15 nm.

The etching of metal gates 52 is performed until the top surfaces of the etched portions of metal gates 52 is lower than the top surface 25TS (FIGS. 14A and 14B) of dielectric dummy fin 25', as shown in FIGS. 14A and 14B. The height difference ΔH may be greater than about 10 nm, and may be in the range between about 10 nm and about 30 nm. As shown in FIG. 14B, when the top surfaces of the etched portions of metal gates 52 are lower than top surface 25TS, the metal gate 52A on the left side of dielectric dummy fin 25' is supposed to be electrical disconnected from the metal gate 52B on the right side of dielectric dummy fin 25'. After the etching process, however, metal gate 52 may have residue portions 52' (FIG. 14A) remaining, which are the top tip portions of metal gate 52, and are referred to as metal gate residue or residue portions of metal gates 52 hereinafter. Metal gate residue 52' is difficult to remove through over-etching since the over-etching needs to be controlled carefully. Otherwise, the opening 70 may be laterally expanded to reach the neighboring protruding fins 24', resulting in the device failure.

Figure 14D:
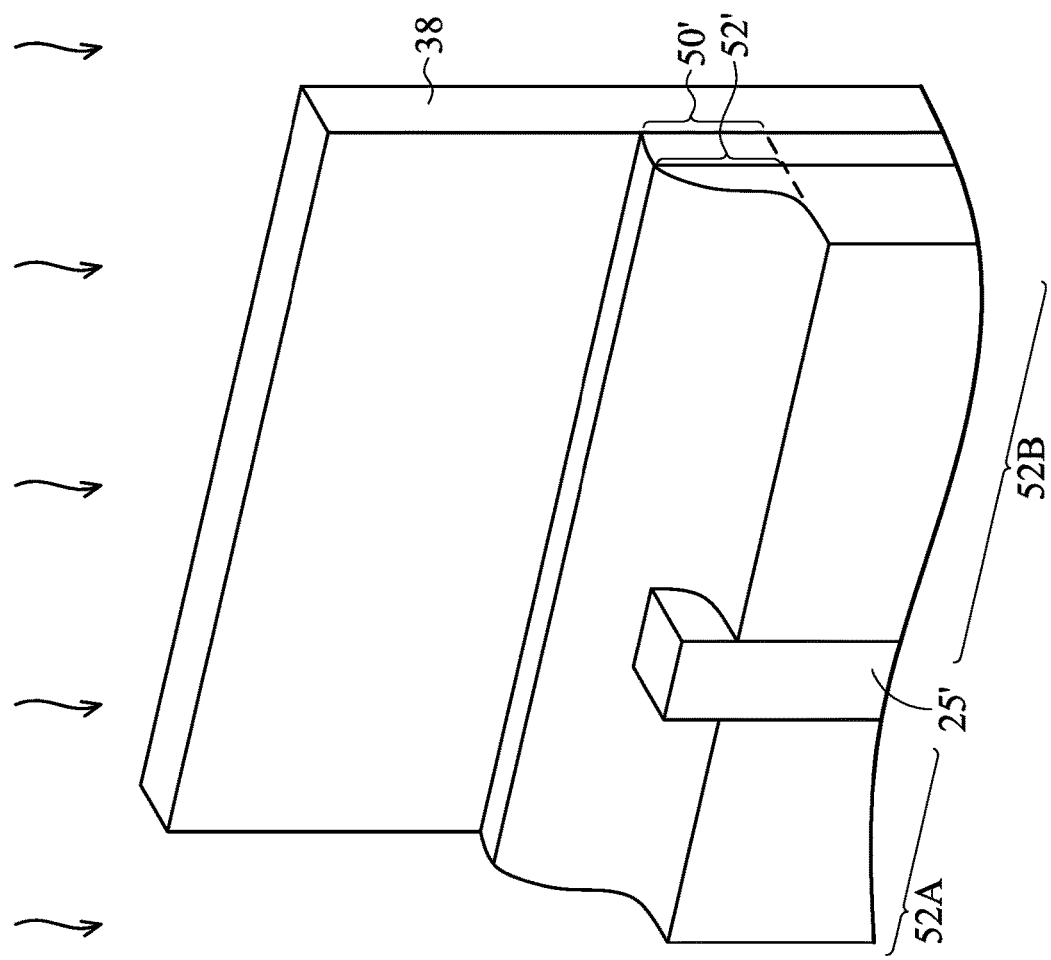

Metal gate residue 52' may cause the adverse bridging of metal gates 52A and 52B, which may lead to device failure. The reason is discussed referring to FIG. 14D, which shows a perspective view of metal gates 52A and 52B and the metal gate residue 52'. As shown in FIG. 14D, metal gates 52A and 52B are on the opposite sides of dielectric dummy fin 25'. The metal gate residue 52' adversely interconnects metal gates 52A and 52B electrically. Accordingly, to eliminate the metal gate bridging, metal gate residue 52' is removed in a subsequent isotropic etching process.

Referring back to FIGS. 14A, 14B, and 14C again, when hard mask 58 is formed of or comprise amorphous silicon (or some other materials), an oxidation process may be performed to oxidize the sidewall surface portions of hard mask 58 in order to form protection layer 74, which protects hard mask 58 in the subsequent isotropic etching process. The respective process is illustrated as process 230 in the process flow 200 as shown in FIG. 21. For example, silicon may react with WF$_6$ (used in the subsequent isotropic etching process) to form WO$_3$, WF$_2$O$_2$, and SiF$_4$, and WO$_3$ further reacts with WF$_6$ to form the gaseous WF$_2$O$_2$, so that silicon will be lost. The protection layer 74 (SiO$_2$, for example) does not react with WF$_6$, and hence can protect amorphous silicon from being etched. In accordance with some embodiments, the oxidation process is performed using H$_2$O (water steam) and ammonia (NH$_3$) as process gases. Water is used for oxidizing amorphous silicon to form silicon oxide. On the other hand, when the oxidation process is performed, metal gates 52 are also exposed to the oxidation. The oxidation process may also be performed when hard mask 58 is not formed of or comprise amorphous silicon, and the oxidation process has the function of oxidizing metal gate residue 52'.

To prevent metal gates 52 from being oxidized excessively, ammonia is added to reduce the oxidation of metal gates 52. The process conditions are controlled so that protection layer 74 may have an adequate thickness, while the metal gate 52 is not excessively oxidized. In accordance with some embodiments, the oxidation is performed with the flow rate of water steam being in the range between about 50 sccm and about 1,500 sccm, and the flow rate of ammonia being in the range between about 10 sccm and about 1,500 sccm. The oxidation duration may be in the range between about 30 seconds and about 300 seconds. The temperature of wafer 10 during the oxidation may be in the range between about 350° C. and about 480° C. In accordance with alternative embodiments, the oxidation process is skipped. The oxidation process may be skipped when hard mask 58 is formed of an oxide such as zirconium oxide, which may not be damaged in the subsequent isotropic etching process.

Next, an isotropic etch is performed to etch metal gate residue 52'. The respective process is illustrated as process 232 in the process flow 200 as shown in FIG. 21. In accordance with some embodiments, the isotropic etch is performed using a fluorine-based etching gas and/or a chlorine-based etching gas. The etching gas, in addition to the fluorine-based etching gas and/or the chlorine-based etching gas, may also include NF$_3$, H$_2$, He, argon, O$_2$, and/or the like. The etching process may be a thermal etching process performed at an elevated temperature, with no plasma turned on.

In accordance with some embodiments of the present disclosure, the fluorine-based etching gas may include a metal fluoride such as tungsten fluoride (WF$_6$, for example). The metal fluoride reacts with the metal oxide generated in the preceding processes, wherein the metal oxide includes the oxidized portions of metal gates 52 as a result of adding oxygen during the etching the metal gates 52 and during the oxidation of hard mask 58. For example, metal gate residue 52' may be oxidized as tungsten oxide or cobalt oxide. The titanium nitride in metal gate residue 52' may also be oxidized as titanium oxide (or titanium oxynitride). Since the metal gate residue 52' is very thin, it may be oxidized effectively, while the lower portions of metal gates 52 are not oxidized.

In accordance with some embodiments, in the isotropic etching process, the NF$_3$ may have a flow rate in the range between 0 sccm and about 500 sccm, the H$_2$ may have a flow rate in the range between 0 sccm and about 500 sccm, the WF$_6$ may have a flow rate in the range between 100 sccm and about 500 sccm, the helium may have a flow rate in the range between 0 sccm and about 1,000 sccm, the argon may have a flow rate in the range between 0 sccm and about 1,000 sccm, and the O$_2$ may have a flow rate in the range between 0 sccm and about 200 sccm. The etching time may be in the range between about 10 seconds and about 90 seconds. The temperature of wafer 10 during the isotropic etching is elevated, and may be in the range between about 400° C. and about 550° C. or higher.

The following chemical reaction equations are examples to show how the metal gate residue 52' is removed, wherein the removed metal gate residue 52' comprises titanium, which has been oxidized to form titanium oxide (TiO$_2$):

$$\text{TiO}_2(s) + \text{WF}_6(g) \rightarrow \text{WO}_3(s) + \text{WF}_2\text{O}_2(g) + \text{TiF}_4(g) \qquad \text{[Eq. 1]}$$
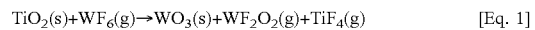

In the reaction, the letters "s" and "g" represent that the respective material are solid or gas, respectively. Since the isotropic etching is performed at an elevated temperature, for example, in the range between about 400° C. and about 550° C. or higher, TiF$_4$ may sublime into gas at this temperature. WF$_2$O$_2$ may also be in the gas form at this temperature. WF$_2$O$_2$ and TiF$_4$ are thus evacuated from the respective reaction chamber. Tungsten oxide WO$_3$ (which may also be generated when the filling metal in metal gates is oxidized) is solid, and may react with WF$_6$(g) again to generate gaseous WF$_2$O$_2$, so it is evacuated. Through similar reactions, if other types of metals are contained in the metal gate residue 52', they are also removed.

In the isotropic etching process, the tip portions of high-k dielectric layer 50 (FIG. 14D) at the same level as metal gate residue 52' are also etched. The removal of the tip portion (residue) of high-k dielectric layer 50 ensures that the intermixing material of high-k dielectric layer 50 and metal gate 52 is removed. The following example shows the removal of hafnium oxide through the etching process:

$$\text{HfO}_2(s) + \text{WF}_6(g) \rightarrow \text{WO}_3(s) + \text{WF}_2\text{O}_2(g) + \text{HfF}_4(g) \qquad \text{[Eq. 2]}$$
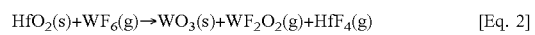

Similarly, WF$_2$O$_2$ and HfF$_4$ are gases at the elevated temperatures, and are evacuated from the respective reaction chamber. WO$_3$ is solid, and may react with WF$_6$(g) again to generate gaseous WF$_2$O$_2$, so it is evacuated. Accordingly, HfO$_2$, which may be a part of high-k dielectric layer 50, is removed.

The isotropic etching process may or may not include a metal chloride etching gas such as boron chloride (BCl$_3$, for example), which may replace the metal fluoride or added into the etching gas in addition to the metal fluoride. The metal chloride results in the sublimate temperature of the products generated by the reaction to be lowered than if metal chloride is not used (instead, a metal fluoride is used). In accordance with some embodiments, by using the metal chloride etching gas, the generated reaction products may have a sublime temperature lower than about 200° C., and the sublime temperature may be in the range between about 100° C. and about 200° C. For example, reaction Equation 3 illustrates a reaction:

$$\text{HfO}_2 + 2\text{BCl}_3 \rightarrow \text{HfCl}_4(s) + 2\text{BOCl}(g) \qquad \text{[Eq. 3]}$$
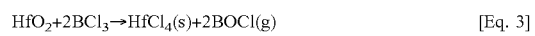

Wherein the sublimate temperature of $HfCl_4$ is lower than $HfF_4$. Gases such as $BF_3$ may be generated along with $HfCl_4$. Also, if $HfF_4$ is generated when $WF_6$ reacts with $HfO_2$ (Equation 2), the following reaction occurs:

$$HfF_4 + BCl_3 \rightarrow HfCl_4(s) + BF_3(g) \quad [Eq. 4]$$

Equation 4 shows that $HfF_4$ reacts with $BCl_3$ to generate $HfCl_4$, which has a low sublimate temperature. Similarly, titanium oxide reacts with $BCl_3$ to generate titanium chloride ($TiCl_x$), which may also be sublimated at lower temperatures than titanium fluoride.

Figure 15A:
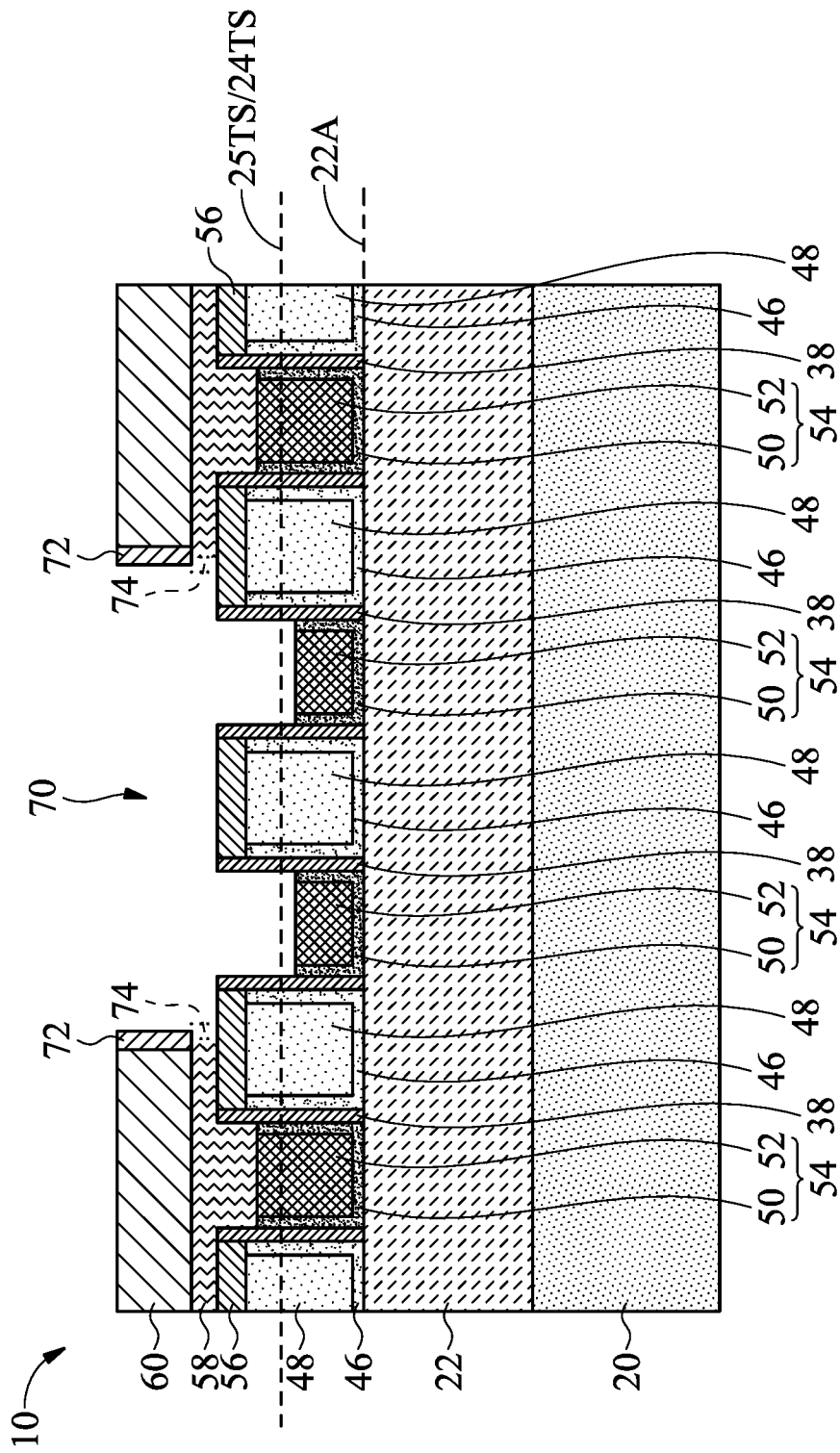
Figure 15B:
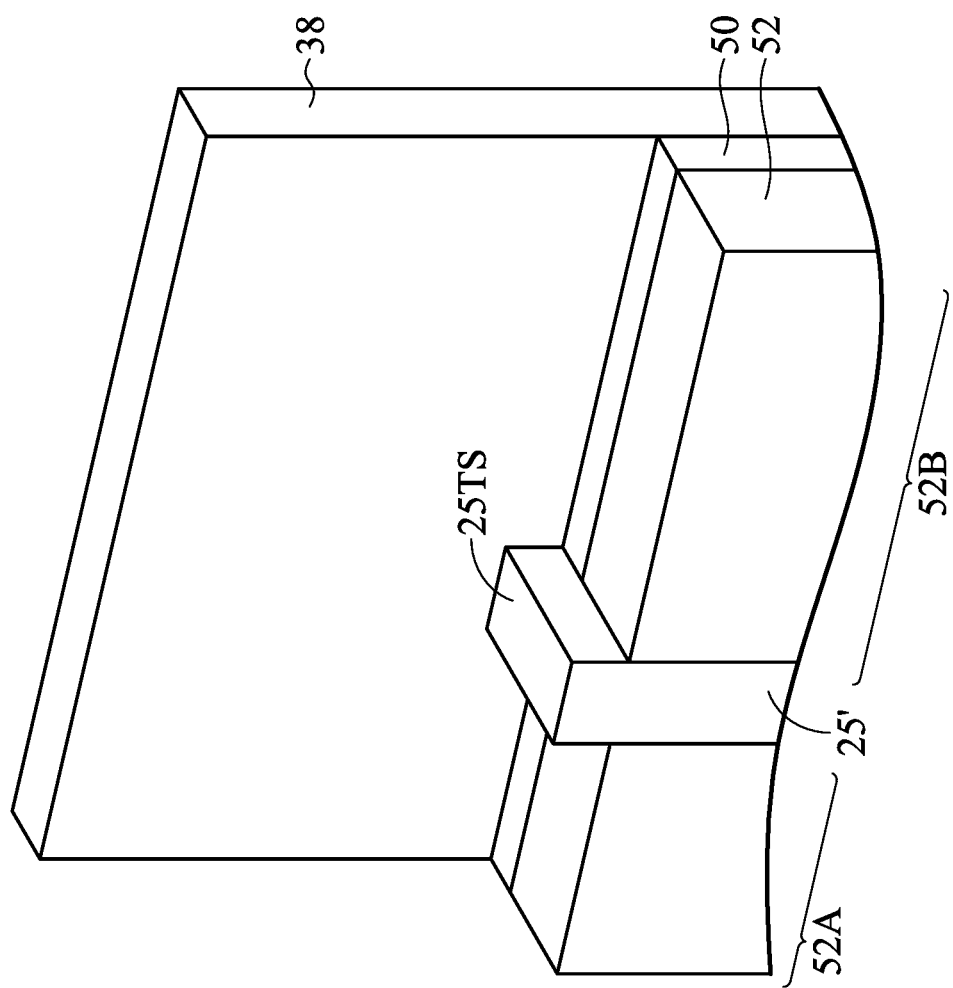

FIG. 15A illustrates the structure after the isotropic etch to remove metal gate residue 52', which shows that the entire top surface of the etched portions of metal gate residue are lower than the top surface 25TS of dielectric dummy fin 25'. FIG. 15B illustrates a perspective view, which shows that by removing the metal gate residue, metal gates 52A and 52B are electrically disconnected. Due to the etching selectivity of metal gate 52 and high-k dielectric 50 in the isotropic etching process, the top surface of metal gate 52 may be slightly higher than, slightly lower than, or level with the top surface of high-k dielectric 50.

Figure 16A:
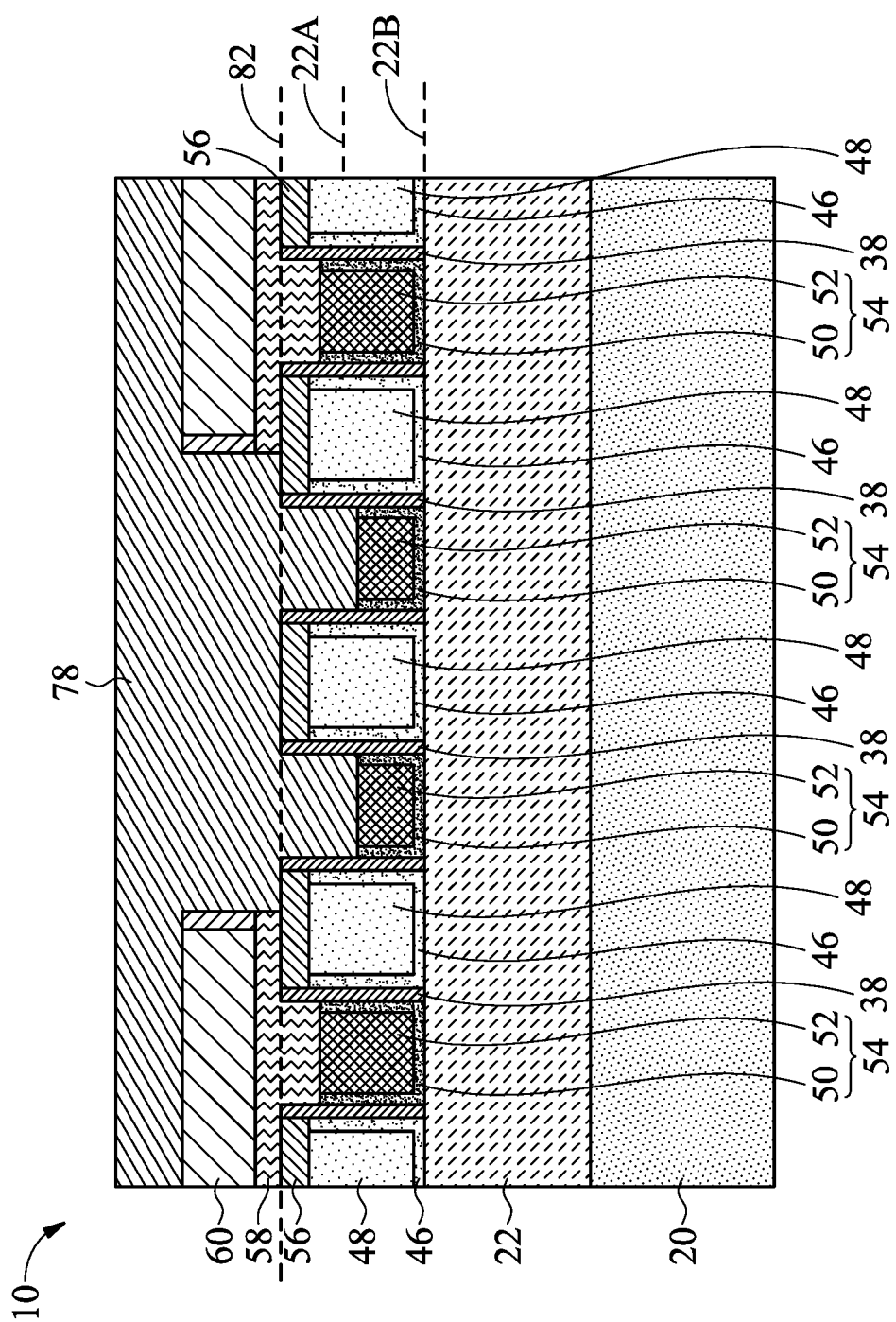
Figure 16B:
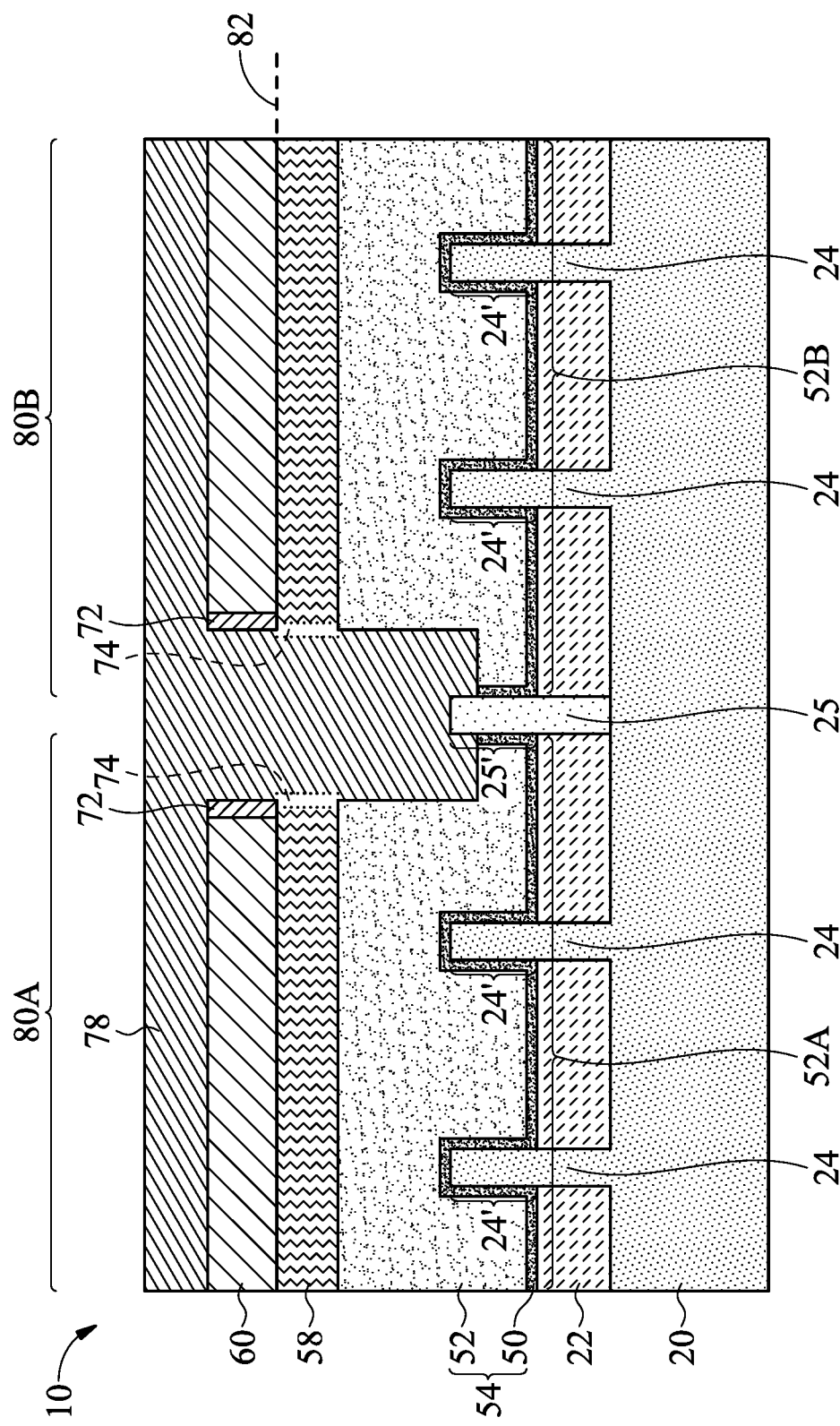
Figure 16C:
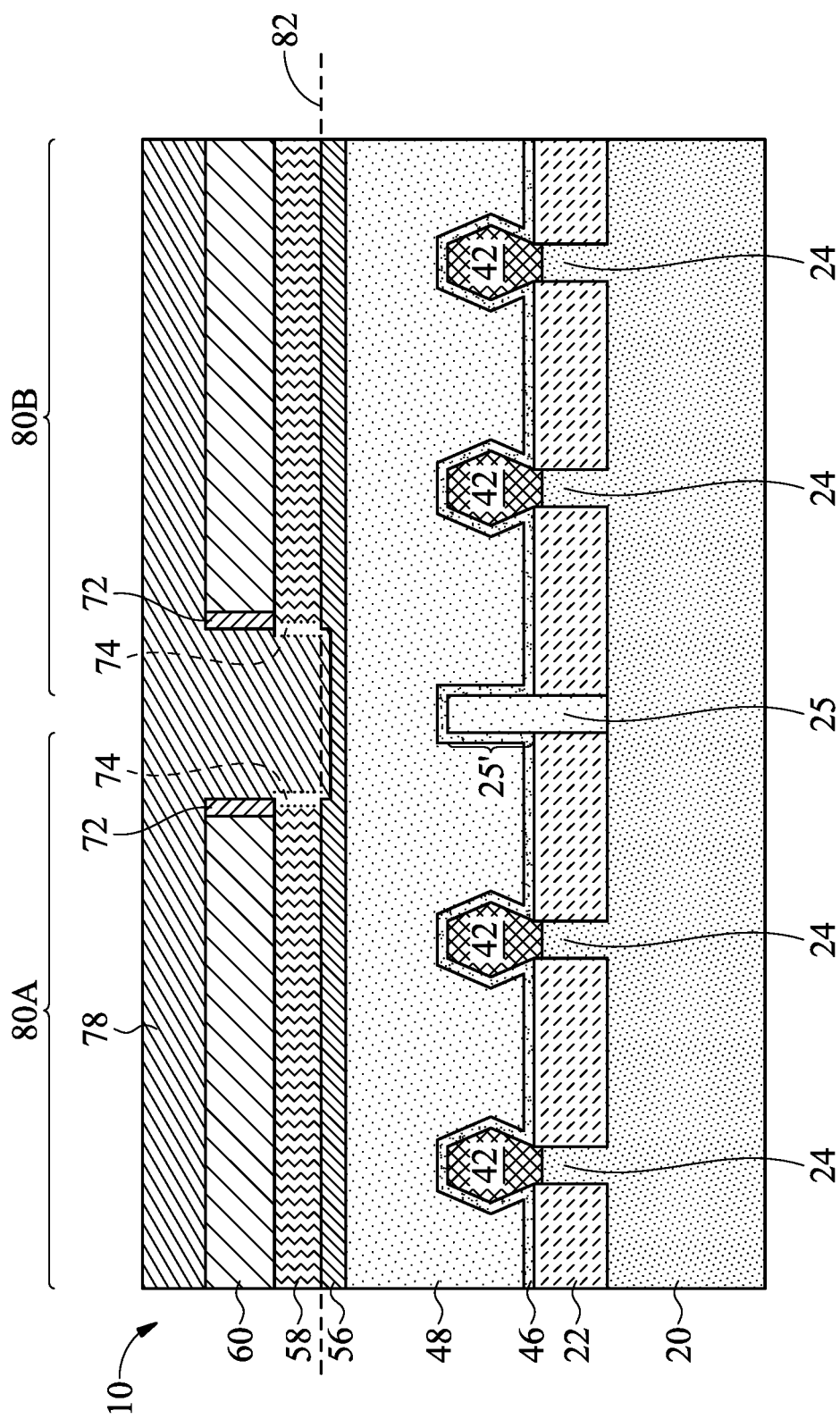

FIGS. 16A, 16B, and 16C illustrate the filling of opening 70 with a dielectric material to form isolation region 78. The respective process is illustrated as process 234 in the process flow 200 as shown in FIG. 21. Isolation region 78 may be formed of or comprise silicon nitride, silicon oxide, silicon oxynitride, or the like. As shown in FIG. 16B, isolation region 78 electrically insulates metal gates 52A and 52B from each other. In accordance with some embodiments, metal gate 52A and the source/drain regions 42 (FIG. 16C) on the left side of dielectric dummy fin 25' form parts of FinFET 80A, and metal gate 52B and the source/drain regions 42 (FIG. 16C) on the right side of dielectric dummy fin 25' form parts of FinFET 80B. In subsequent processes, a planarization process such as a CMP process or a mechanical grinding process is performed to remove the top portions of the isolation region 78. For example, the planarization process may be stopped on the top surfaces of hard masks 56, and the level 82 in FIGS. 16A, 16B, and 16C represents the corresponding stopping level of the planarization in accordance with some embodiments.

Figure 17A:
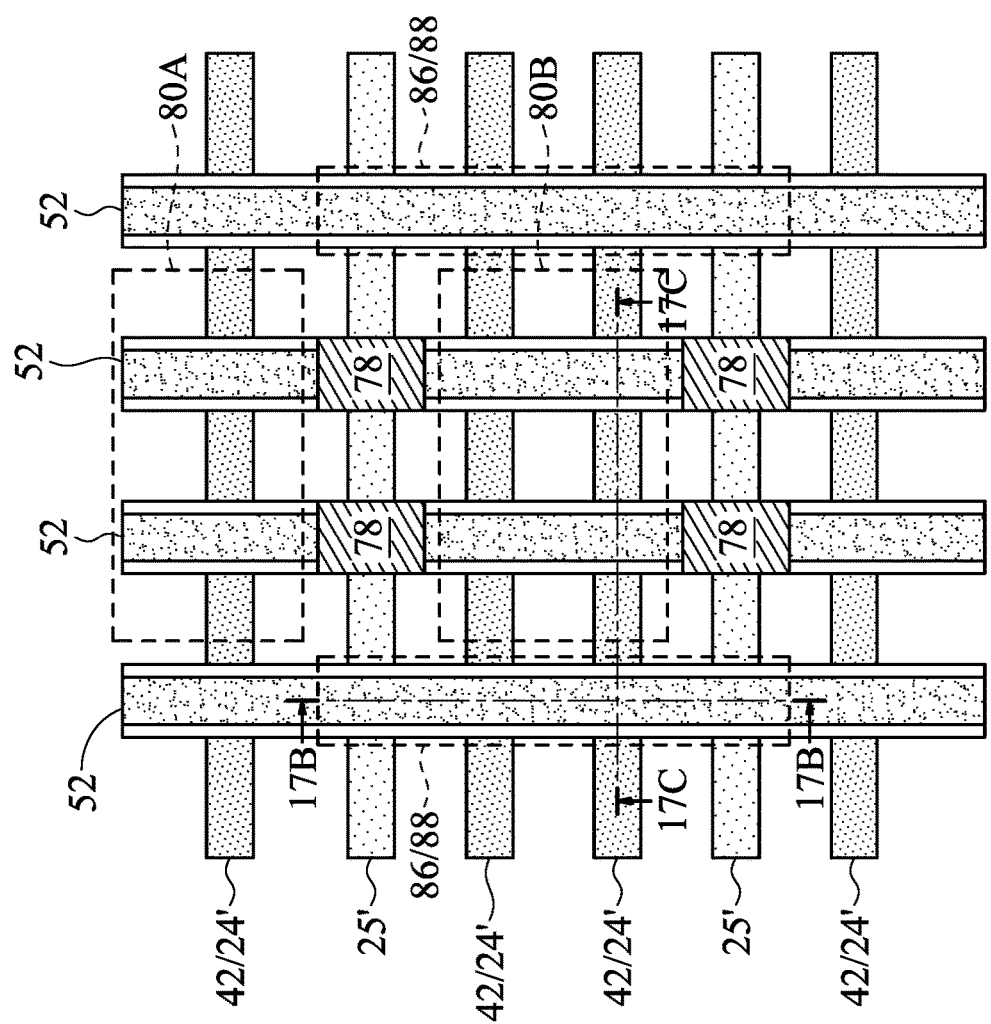
Figure 17B:
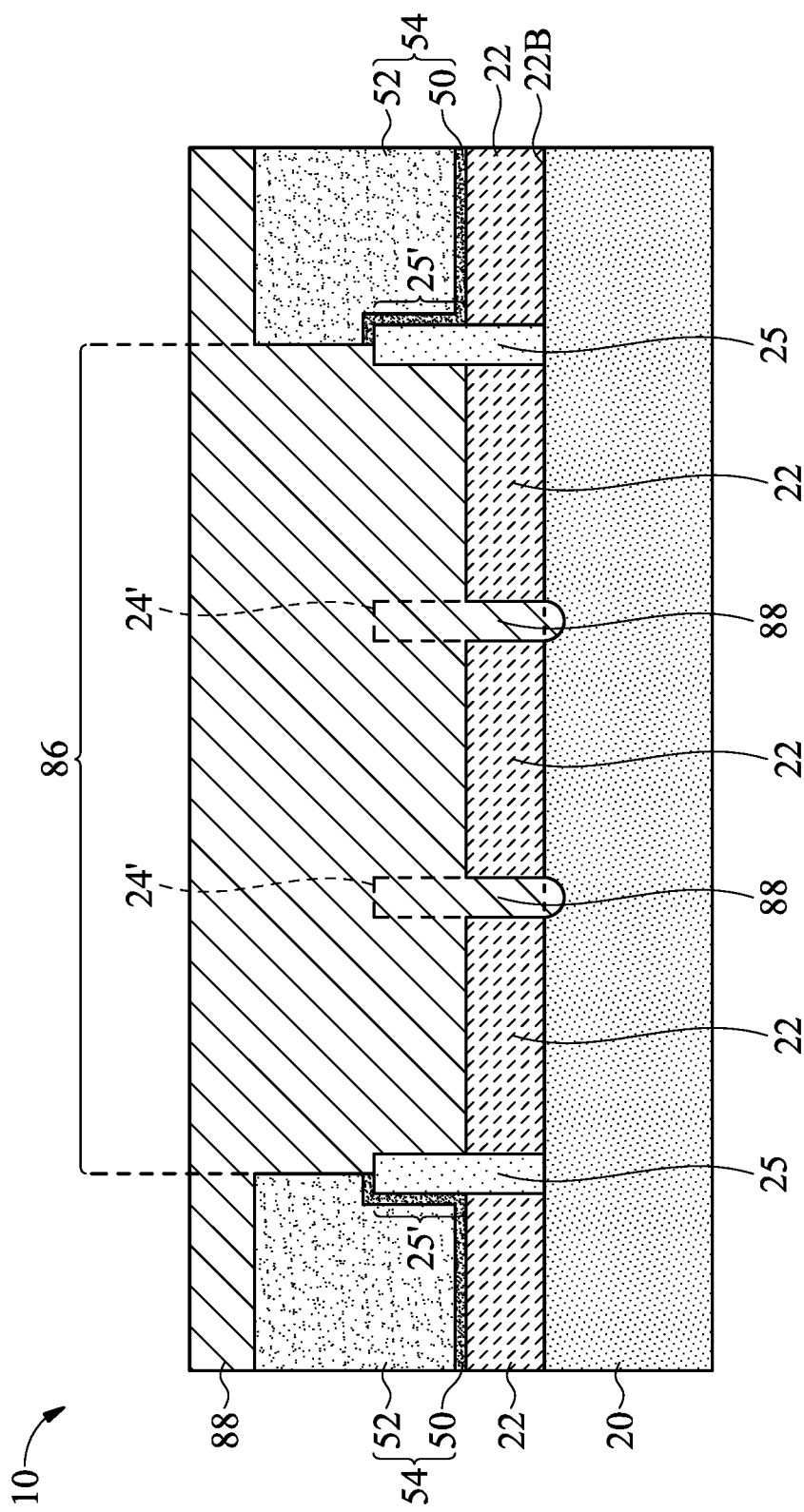
Figure 17C:
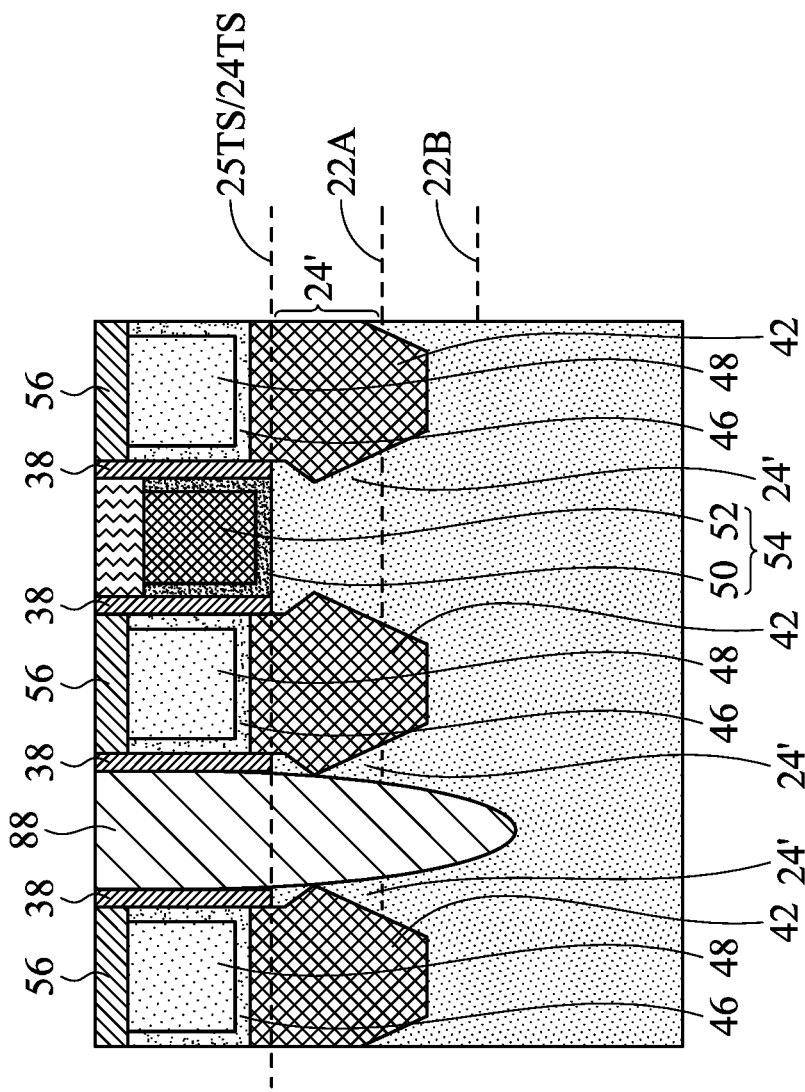

FIG. 17A illustrates a plane view of the structure shown in FIGS. 16A, 16B, and 16C after the formation of isolation regions 78. The preceding metal-gate-cutting process results in isolation region 78 to insulate the gate electrodes of FinFET 80B from the metal gates of the neighboring FinFETs such as 80A. To further electrically insulate the protruding fins 24' of FinFET 80B from neighboring FinFETs, a fin-cut process is performed to cut the portions of protruding fins 24' in regions 86. The respective processes include forming and patterning etching masks (not shown), wherein openings are formed in the etching masks to reveal the features in regions 86. The portions of metal gates 52 in regions 86 are then etched to reveal the underlying protruding fins 24'. FIG. 17B illustrates a cross-sectional view, wherein region 86 is illustrated, and the portions of metal gate 52 in region 86 is removed. The positions of the protruding fins 24' are illustrated using dashed rectangles. The protruding fins 24' are then etched, and the corresponding recess may extend lower than the bottom surface 22B of STI regions 22. The respective process is referred to as a cut-fin process. The respective process is illustrated as process 236 in the process flow 200 as shown in FIG. 21. Next, a dielectric material is filled in the recess to form isolation region 88. Isolation region 88 may be formed of or comprise silicon nitride, silicon oxide, silicon oxynitride, or the like. After the formation of isolation region 88, a planarization process is performed, and the portions of isolation region 88 over metal gate 52 are removed. FIG. 17B illustrates the reference cross-section 17B-17B in FIG. 17A. FIG. 17C further illustrates the reference cross-section 17C-17C in FIG. 17A. As shown in FIG. 17C, isolation region 88 cuts protruding fin 24' and source/drain regions 42 of different FinFETs from each other.

Figure 18A:
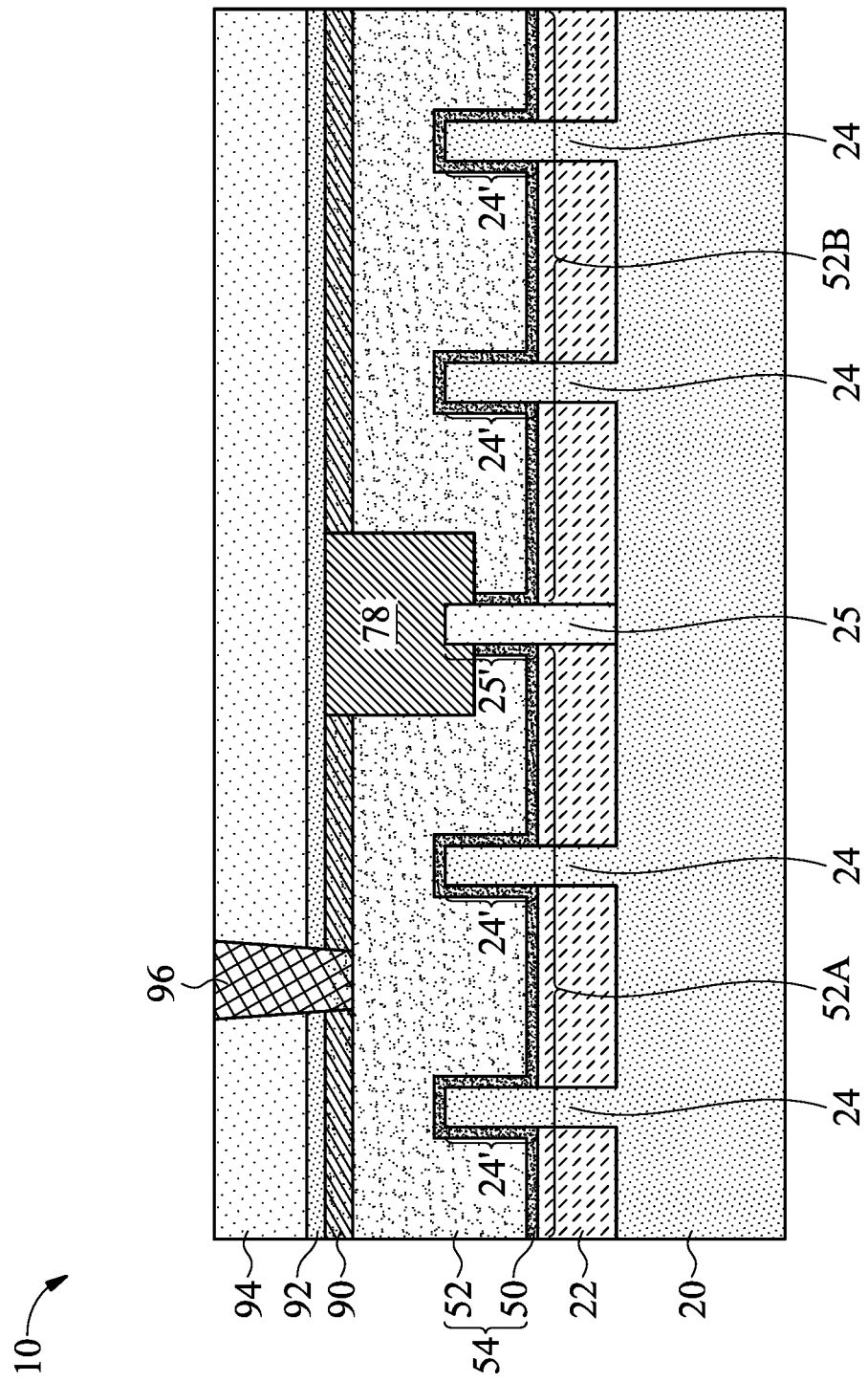
Figure 18B:
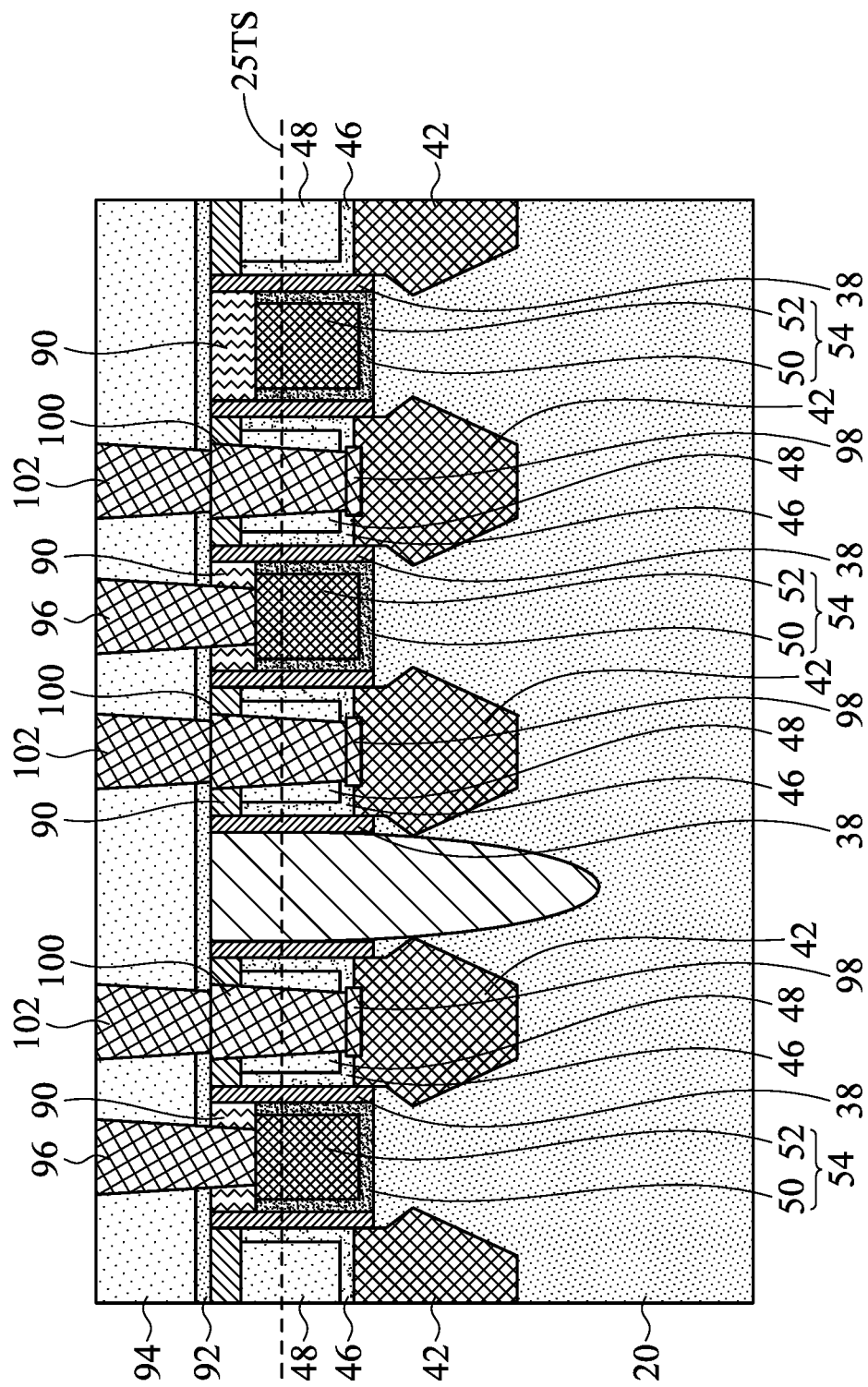

FIGS. 18A and 18B illustrate the formation of hard mask 90, which is formed by etching hard mask 58 (FIG. 16B) to form a recess, and filling hard mask 90 into the recess, followed by a planarization process, so that the top surface of hard mask 90 is coplanar with the top surface of isolation region 78. Hard mask 90 may be formed of or comprise silicon nitride, silicon oxide, silicon oxynitride, or the like. Etch stop layer 92 and ILD 94 are then deposited, followed by the formation of gate contact plug 96 to contact metal gate 52. FIG. 18B illustrates the formation of source/drain silicide regions 98, lower source/drain contact plugs 100, and upper source/drain contact plugs 102. In accordance with some embodiments, the formation of silicide region 98 and lower source/drain contact plugs 100 includes etching ILD 48 and CESL 46 to form a contact opening, depositing a metal layer (such as Ti) into the contact opening, forming a barrier layer (such as TiN) over the Ti layer, performing an annealing process to form silicide region, and depositing the remaining contact with a metallic material such as tungsten, cobalt, or the like.

Figure 20:
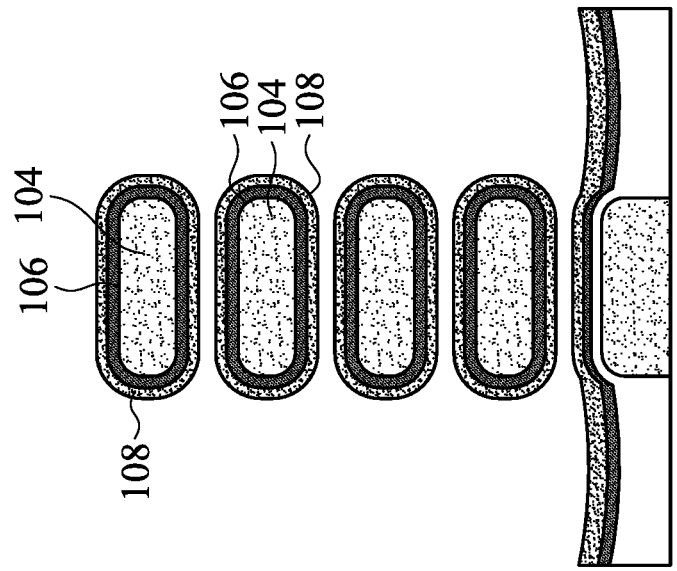
FIGS. 19 and 20 illustrate the cross-sectional views of intermediate stages in the formation of a Gate All-Around (GAA) Transistor in accordance with some embodiments.
Figure 19:
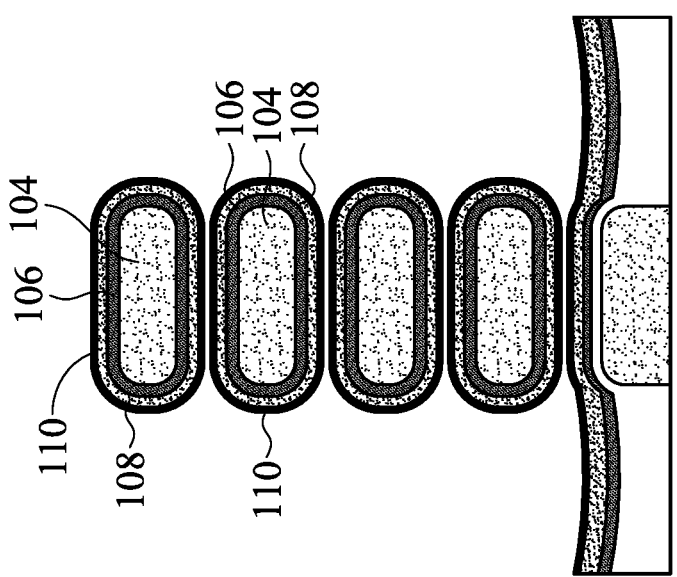

The embodiments of the present disclosure for etching metal gate residue may also be used for the formation of other types of transistors such as planar transistors and GAA transistors. For example, FIG. 19 illustrates the formation of the channel portions of a GAA transistor, which includes semiconductor nanostructure (e.g. nanowire, nanosheet, etc.) 104, ILs 106, high-k dielectrics 108, and metal layers (such as work function metal layers formed of TiAlC, for example) 110. The embodiments of the present disclosure may be applied to cut the metal layers 110 into discrete portions through etching, so that each portions may be used to form a GAA transistor, wherein the cut portion with metal layers 110 removed is shown in FIG. 20. The top view of the corresponding structure is similar to the structure in FIG. 17A, except that the protruding fins 24' in FIG. 17A are now replaced with semiconductor nanostructure. Similarly, the etching of the metal layers 110 and possibly high-k dielectrics 108, and the corresponding removal of the residues of the metal layers 110 may be essentially the same as aforementioned, and are not repeated herein. Also, the embodiments may be applied on the cutting of high-k dielectrics 108. Since the methods for etching metal in accordance with the embodiments are isotropic, the metal layer 110 and high-k dielectric layer 108 may be cut, although they are not facing outside.

Experiment results obtained from sample wafers indicate that by using the embodiments to remove metal gate residue, the metal gate residue can be effectively removed without causing significant enlargement of the opening in metal gates. The experiment results further indicate that by performing an oxidation process to form protection layer 74 on the sidewall of amorphous silicon hard mask 58, the damage is effectively controlled.

The embodiments of the present disclosure have some advantageous features. It is difficult to use plasma etching to cut metal gates without leaving metal gate residue on the sidewalls of the gate spacers. The metal gate residue may cause the electrical shorting of the metal gates that are intended to be separated by the cutting process. In accordance with some embodiments of the present disclosure, an isotropic etching process is used to remove the metal gate residue. Furthermore, the products of the etching are gases, and can be removed. This effectively removes the metal oxide that may be generated by the etching process. Since the metal oxide affects threshold voltages of transistors, by removing the metal oxide (through gases), there is no more adverse effect of the metal oxide on the threshold voltages of the resulting transistors.

In accordance with some embodiments of the present disclosure, a method includes forming a gate dielectric layer; forming a metal gate strip over a bottom portion of the gate dielectric layer; performing a first etching process on the metal gate strip to remove a portion of the metal gate strip, wherein the first etching process is performed anisotropically; after the first etching process, performing a second etching process on the metal gate strip to remove a residue portion of the metal gate strip, wherein the second etching process comprises an isotropic etching process; and filling a dielectric material into a recess left by the etched portion and the etched residue portion of the metal gate strip. In an embodiment, the first etching process is performed until a dielectric dummy fin underlying the metal gate strip is exposed. In an embodiment, the first etching process is performed until a corresponding recess generated by the etched portion of the metal gate strip has a bottom surface lower than a top surface of the dielectric dummy fin, and the residue portion comprises a lower portion lower than the top surface and an upper portion higher than the top surface. In an embodiment, the second etching process is performed using an etching gas comprising tungsten fluoride. In an embodiment, the etching gas further comprises tungsten chloride. In an embodiment, the first etching process is performed with plasma, and the second etching process comprises a thermal etching process without plasma. In an embodiment, in the second etching process, a tip portion of the gate dielectric layer at a same level as the residue portion of the metal gate strip is further etched. In an embodiment, the first etching process and the second etching process are performed using a same etching mask. In an embodiment, the method further includes forming a hard mask over the metal gate strip; patterning the hard mask; and oxidizing the hard mask to form a protection layer on a sidewall of the hard mask, wherein the protection layer is exposed to the second etching process.

In accordance with some embodiments of the present disclosure, a method includes forming a gate stack over and contacting a dielectric dummy fin, wherein the gate stack comprises: a first portion on a first side of the dielectric dummy fin; a second portion on a second side of the dielectric dummy fin; a third portion overlapping the gate stack, wherein the third portion interconnects the first portion and the second portion; etching the third portion to reveal a top surface and sidewalls of the dielectric dummy fin, wherein after the etching, a residue portion of the third portion is left, and the residue portion interconnects the first portion and the second portion; and etching the residue portion. In an embodiment, the first portion and the second portion form metal gates of a first FinFET and a second FinFET, respectively. In an embodiment, the etching the third portion is performed using an etching gas comprising a metal fluoride. In an embodiment, the metal fluoride comprises tungsten fluoride. In an embodiment, the etching gas further comprises a metal chloride. In an embodiment, the residue portion comprises a portion of a gate dielectric of the gate stack, and a portion of a metal gate of the gate stack, and in the etching the residue portion, the portion of the gate dielectric and the portion of the metal gate are removed.

In accordance with some embodiments of the present disclosure, a method includes forming a metal gate strip; forming an amorphous layer over the metal gate strip; forming a patterned hard mask over the amorphous layer; etching the amorphous layer using the patterned hard mask as an etching mask, wherein the metal gate strip is revealed; etching the metal gate strip to form a recess in the metal gate strip, wherein the recess has a bottom surface lower than a top surface of an underlying dielectric dummy fin, and the top surface and opposite sidewalls of the dielectric dummy fin are exposed to the recess; performing a thermal etching process to remove a residue portion of the metal gate strip; and filling a dielectric material into the recess. In an embodiment, after the etching the metal gate strip, sidewalls of gate spacers are exposed to the recess, and the gate spacers are on opposite sides of the recess, and the gate spacers are not etched in the etching the metal gate strip. In an embodiment, the method further includes, after the etching the amorphous silicon layer and before the etching the metal gate strip, oxidizing a surface portion of the amorphous silicon layer. In an embodiment, the oxidizing is performed using water steam and ammonia as process gases. In an embodiment, the etching the metal gate strip is performed using a process gas comprising a metal fluoride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
  forming a gate dielectric layer;
  forming a metal gate strip over a bottom portion of the gate dielectric layer;
  forming a hard mask over the metal gate strip;
  patterning the hard mask;
  performing a first etching process on the metal gate strip to remove a portion of the metal gate strip, wherein the first etching process is performed anisotropically;
  oxidizing the hard mask to form a protection layer on a sidewall of the hard mask;
  after the first etching process, performing a second etching process on the metal gate strip to remove a residue portion of the metal gate strip, wherein the second etching process comprises an isotropic etching process, and wherein the protection layer is exposed to the second etching process; and
  filling a dielectric material into a recess left by the etched portion and the etched residue portion of the metal gate strip.

2. The method of claim 1, wherein the first etching process is performed until a dielectric dummy fin underlying the metal gate strip is exposed.

3. The method of claim 2, wherein the first etching process is performed until a corresponding recess generated by the etched portion of the metal gate strip has a bottom surface lower than a top surface of the dielectric dummy fin, and the residue portion comprises a lower portion lower than the top surface and an upper portion higher than the top surface.

4. The method of claim 1, wherein the second etching process is performed using an etching gas comprising tungsten fluoride.

5. The method of claim 4, wherein the etching gas further comprises tungsten chloride.

6. The method of claim 1, wherein the first etching process is performed with plasma, and the second etching process comprises a thermal etching process without plasma.

7. The method of claim 1, wherein in the second etching process, a tip portion of the gate dielectric layer at a same level as the residue portion of the metal gate strip is further etched.

8. The method of claim 1, wherein the first etching process and the second etching process are performed using a same etching mask.

9. A method comprising:
  forming a gate stack over and contacting a dielectric dummy fin, wherein the gate stack comprises:
    a first portion on a first side of the dielectric dummy fin;
    a second portion on a second side of the dielectric dummy fin;
    a third portion overlapping the gate stack, wherein the third portion interconnects the first portion and the second portion;
  etching the third portion, a first part of the first portion, and a second part of the second portion of the gate stack to reveal a top surface and sidewalls of the dielectric dummy fin, wherein after the etching, a residue portion of the third portion is left, and the residue portion interconnects the first portion and the second portion; and
  etching the residue portion.

10. The method of claim 9, wherein the first portion and the second portion form metal gates of a first Fin Field-Effect Transistor (FinFET) and a second FinFET, respectively.

11. The method of claim 9, wherein the etching the third portion is performed using an etching gas comprising a metal fluoride.

12. The method of claim 11, wherein the metal fluoride comprises tungsten fluoride.

13. The method of claim 9 further comprising:
  forming a silicon-containing mask layer over the gate stack;
  etching the silicon-containing mask layer to form an opening penetrating through the silicon-containing mask layer; and
  performing an oxidation process to oxidize exposed portions of the silicon-containing mask layer to form a protection layer, wherein the protection layer is exposed when the residue portion is etched.

14. The method of claim 9, wherein the residue portion comprises a portion of a gate dielectric of the gate stack, and a portion of a metal gate of the gate stack, and in the etching the residue portion, the portion of the gate dielectric and the portion of the metal gate are removed.

15. A method comprising:
  forming a metal gate strip;
  forming an amorphous layer over the metal gate strip;
  forming a patterned hard mask over the amorphous layer;
  etching the amorphous layer using the patterned hard mask as an etching mask, wherein the metal gate strip is revealed;
  etching the metal gate strip to form a recess in the metal gate strip, wherein the recess has a bottom surface lower than a top surface of an underlying dielectric dummy fin, and the top surface and opposite sidewalls of the underlying dielectric dummy fin are exposed to the recess;
  performing a thermal etching process to remove a residue portion of the metal gate strip; and
  filling a dielectric material into the recess.

16. The method of claim 15, wherein after the etching the metal gate strip, sidewalls of gate spacers are exposed to the recess, and the gate spacers are on opposite sides of the recess, and the gate spacers are not etched in the etching the metal gate strip.

17. The method of claim 15 further comprising, after the etching the amorphous layer and before the etching the metal gate strip, oxidizing a surface portion of the amorphous layer.

18. The method of claim 17, wherein the oxidizing is performed using water steam and ammonia as process gases.

19. The method of claim 15, wherein the etching the metal gate strip is performed using a process gas comprising a metal fluoride.

* * * * *